United States Patent
Tsuboyama et al.

(10) Patent No.: US 7,413,818 B2
(45) Date of Patent: Aug. 19, 2008

(54) LIGHT-EMITTING DEVICE

(75) Inventors: Akira Tsuboyama, Tokyo (JP); Shinjiro Okada, Kanagawa (JP); Takao Takiguchi, Tokyo (JP); Jun Kamatani, Tokyo (JP); Manabu Furugori, Tokyo (JP); Katsuaki Kuge, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 536 days.

(21) Appl. No.: 10/951,686

(22) Filed: Sep. 29, 2004

(65) Prior Publication Data

US 2005/0079384 A1 Apr. 14, 2005

(30) Foreign Application Priority Data

Oct. 1, 2003 (JP) .............................. 2003-343157
Sep. 15, 2004 (JP) .............................. 2004-267705

(51) Int. Cl.
*H01L 51/54* (2006.01)
*C09K 11/06* (2006.01)

(52) U.S. Cl. ...................... 428/690; 428/917; 313/504; 313/506; 257/E51.041; 257/E51.044

(58) Field of Classification Search .................. None
See application file for complete search history.

(56) References Cited

U.S. PATENT DOCUMENTS 7,279,233 B2 * 10/2007 Tsuboyama et al. ......... 428/690
2003/0186080 A1 10/2003 Kamatani et al. ........... 428/690

FOREIGN PATENT DOCUMENTS

JP 2940514 6/1999

OTHER PUBLICATIONS

Healy et al., "Lewis-base Adducts of Group 1B Metal(I) Compounds . . . ", J. Chem. Soc. Dalton Trans. (1985), pp. 2531-2539.*
Yuguang Ma et al., "High Luminescence Gold(I) and Copper(I) Complexes with a Triplet Excited State for Use in Light-Emitting Diodes", *Adv. Mater.*, 1999, vol. 11, No. 10, pp. 852-857.
C. H. Chen et al., "Recent Developments in Molecular Organic Electroluminescent Materials", *Macromol. Symp.*, vol. 125, 1997, pp. 1-48.
Peter C. Ford et al., "Photoluminescence Properties of Multinuclear Copper (I) Compounds", *Chem. Rev.*, vol. 99, 1999, pp. 3625-3647.
Araki, et al; "Effect of N-hetero-aromatic ligand on luminescence of halogen-bridged copper (I) binuclear comples"; 15th Photochemistry Panel Discussion of Coordination compound; Seikei University, abstract, P-23, pp. 91-92 (Aug. 2002) English Translation thereof.
U.S. Appl. No. 10/886,570, filed Jul. 9, 2004.

* cited by examiner

*Primary Examiner*—Marie R. Yamnitzky
(74) *Attorney, Agent, or Firm*—Fitzpatrick, Cella, Harper & Scinto

(57) ABSTRACT

There is provided an organic light-emitting device obtained by using a specific copper coordination compound as a light-emitting material, which has a basic structure in which two copper ions are crosslinked in a ring form by one of atomic groups containing a halogen atom, a sulfur atom, and an nitrogen atom. The light-emitting device provides high luminescence efficiency and high stability at low cost by using an inexpensive copper coordination compound as a light-emitting material.

5 Claims, 3 Drawing Sheets

US 7,413,818 B2

LIGHT-EMITTING DEVICE

BACKGROUND OF THE INVENTION

1. Field of the Invention

The present invention relates to a light-emitting device using an organic compound. More specifically, the present invention relates to an organic light-emitting device using a metal coordination compound as a light-emitting material so as to allow high luminescence efficiency in a stable manner.

2. Related Background Art

An organic electroluminescence (EL) device has been extensively studied for its practical application as a light-emitting device with a high responsiveness and high luminescence efficiency (see, e.g., "Macromol. Symp.", 125, pp. 1-48 (1997)).

A copper coordination compound can be produced at a comparatively low cost because of inexpensive raw materials. Thus, exploiting the characteristics of the copper coordination compound would lead to a high-performance organic EL device with low cost.

For instance, organic EL devices using copper complexes have been disclosed in Japanese Patent No. 2940514 B and Y. Ma et al., "High Luminescence Gold (1) and Copper (1) complexes with Triplet Excited State for Use in Light-Emitting Diodes", Advanced Materials, 1999, 11, No. 10, p. 852. However, these EL devices are extremely poor in luminescence efficiency and described insufficiently in these documents in terms of their efficiency. The characteristics of the cooper coordination compound may be insufficiently brought out. Thus, the cooper coordination compound has insufficient property to be used for a display, illumination, or the like.

Furthermore, in "Chemical Review", 1999, 99, p. 3625-3647 and the proceedings of "the 15th Photochemistry Panel Discussion of Coordination Compound" (Japan), 2001, p. 91, copper coordination compounds are disclosed. However, these documents describe only photoluminescence emitted in a solution or crystalline particle powder, while no luminescence of an organic EL device under excitation with an electric current is described.

SUMMARY OF THE INVENTION

An object of the present invention is to provide a light-emitting device with high luminescence efficiency, high stability, and low cost using an inexpensive copper coordination compound.

An organic light-emitting device according to the present invention includes a copper coordination compound having a partial structural formula represented by the following general formula (1) as a light-emitting material:

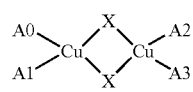
(1)

(In the formula (1), Cu represents a copper ion; X represents an atomic group containing a halogen, sulfur, or nitrogen atom; and at least one of A1 to A3 is a ligand composed of an atomic group containing a carbon atom and may be covalently bound to another one).

In the organic light-emitting device according to the present invention, a copper coordination compound is preferably used as a light-emitting material, which has a partial structural formula represented by one of the following general formulae (2) to (8) that contains the partial structure represented by the general formula (1):

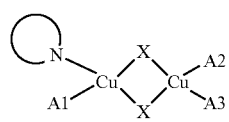
(2)

(In the formula (2), Cu represents a copper ion; X represents an atomic group containing a halogen, sulfur, or nitrogen atom; N represents a nitrogen atom of an imine group in a cyclic group; and at least one of A1 to A3 is a ligand composed of an atomic group containing a carbon atom and may be covalently bound to another one).

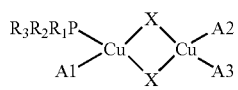
(3)

(In the formula (3), Cu represents a copper ion; X represents an atomic group containing a halogen, sulfur, or nitrogen atom; P represents a phosphorus atom in a phosphine compound; $R_1$ to $R_3$ independently or identically represent a linear, branched, or cyclic alkyl group or an aromatic ring group which may have a substituent; and at least one of A1 to A3 is a ligand composed of an atomic group containing a carbon atom and may be covalently bound to another one).

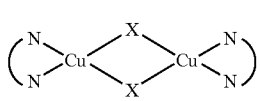
(4-1)

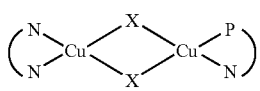
(4-2)

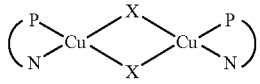
(4-3)

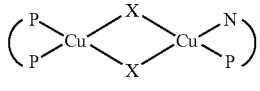
(4-4)

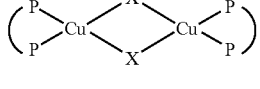
(4-5)

(In the formulae (4-1) to (4-5), Cu represents a copper ion; X represents an atomic group containing a halogen, sulfur, or nitrogen atom; and N—N, P—N, and P—P represent bidentate ligands in which each ligand has two coordinating atoms, where N—N contains two nitrogen atoms of an imine group, P—N contains one nitrogen atom of the imine group and one phosphorous atom, and P—P contains two phosphorous atoms).

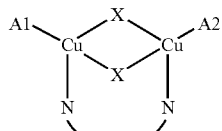

(5-1)

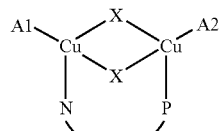

(5-2)

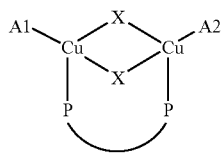

(5-3)

(In the formulae (5-1) to (5-3), Cu represents a copper ion; X represents a halogen atom; N represents a nitrogen atom in an imine group; P represents a phosphorus atom; N—N, P—N, and P—P represent multidentate ligands in which each ligand has two or more coordinating atoms, where N—N contains two nitrogen atoms of the imine group, P—N contains one nitrogen atom of the imine group and one phosphorous atom, and P—P contains two phosphorous atoms; and each of A1 and A2 represents a ligand composed of an atomic group containing a carbon atom).

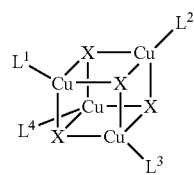

(6)

(In the formula (6), Cu represents a copper ion; X represents a halogen atom; and $L^1$ to $L^4$ represent monodentate coordinated with a nitrogen atom or a phosphorus atom).

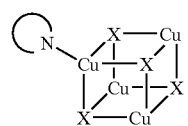

(7)

(In the formula (7), Cu represents a copper ion; X represents a halogen atom; and N represents a nitrogen atom of an imine group in a cyclic group).

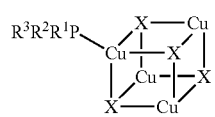

(8)

(In the formula (8), Cu represents a copper ion; X represents a halogen atom; P represents a phosphorus atom in a phosphine compound; and $R^1$ to $R^3$ independently or identically represent a linear, branched, or cyclic alkyl group or an aromatic ring group which may have a substituent).

Further, in the organic light-emitting device according to the present invention, the following structures are included as preferred modes:

the copper ion has a valence of +1;

the copper coordination compound is used as a light-emitting material, which has the partial structural formula represented by the general formula (1) is a high-molecular copper coordination compound that contains two or more of the partial structure formulae at regular intervals;

the copper coordination compound is used as a light-emitting material, which has the partial structural formula represented by the general formula (1) is a non-ionic copper coordination compound that is electrically neutral; and the light-emitting layer contains a portion in which a content of the light-emitting material is 100%.

DESCRIPTION OF THE PREFERRED EMBODIMENTS

Figure 1A:
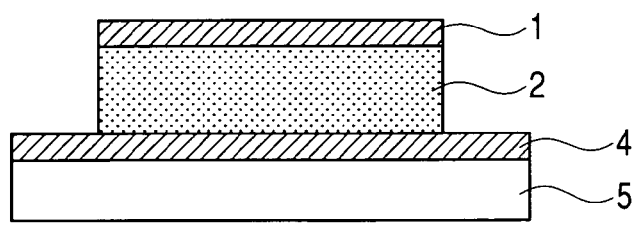
FIGS. 1A, 1B, 1C and 1D are cross-sectional schematic diagrams that illustrate the configuration of a light-emitting device of the present invention.

An organic light-emitting device of the present invention employs a copper coordination compound having a specific partial structural formula as a light-emitting material so that the organic light-emitting device can be cost-effectively provided with high luminescence efficiency and stable luminescence.

Hereinafter, the organic EL device of the present invention will be described in detail.

At first, the characteristics of a copper coordination compound (copper complex) as a light-emitting material of the present invention will bed described.

The copper coordination compound used in the present invention has a partial structural formula represented by the following general formula (1).

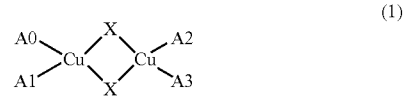

(1)

In the formula (1), Cu represents a copper ion; X represents an atomic group containing a halogen, sulfur, or nitrogen atom; and at least one of A0 to A3 is a ligand composed of an atomic group containing a carbon atom and may be covalently bound to another one.

In other words, the copper coordination compound used in the present invention is a coordination compound having a cross-linked portion with two atomic groups each containing a halogen, sulfur, or nitrogen atom. A copper coordination compound cross-linked by a halogen atom is suited for a light-emitting material because of its thermal stability and high luminescence efficiency. Particularly in a solid powder state, the copper coordination compound cross-linked by a halogen atom characteristically shows higher luminescence efficiency than that of another compound. In addition, even if the copper coordination compound is cross-linked by a sulfur atom, the copper coordination compound shows high luminescence efficiency and excellent chemical stability. Besides, various kinds of copper coordination compounds may be designed by providing a ligand having a sulfur atom with any of various substituents. In general, most of compounds, which emit luminescence in their dilute solutions, generate extremely poor luminescence when they are in solid powder states. Those compounds form association products in the ground state or excited association products by the interaction between light-emitting material molecules, so that the natural luminescence properties of the compounds are no longer obtained. Such a phenomenon is known as a "concentration quenching".

The copper coordination compound of the present invention can be a light-emitting material which is hardly subjected to the concentration quenching. Therefore, when a light-emitting layer in a light-emitting device is considered, the concentration quenching can be generally avoided by the addition of a small amount of a light-emitting material as a guest material to a host material. As the light-emitting material of the present invention is not subjected to the concentration quenching, the light-emitting layer may contain the light-emitting material in higher concentration or in 100% concentration. Therefore, the light-emitting device having high luminescence efficiency and improved productivity can be produced. In addition, the luminescence property of the light-emitting material of the present invention shows a small concentration dependence and retrains variations in production and so on. Also from this viewpoint, the light-emitting material of the present invention allows the production of a light-emitting device having high productivity.

A copper ion used as the central metal of the copper complex is preferably a positively charged monovalent copper ion. When the electron configuration of a copper atom is taken into consideration, the positively-charged monovalent copper ion contains 10 d-electrons. Generally, a transition metal having d-electrons in even number often shows good luminescence property.

The copper coordination compounds, which can be used in the present invention, are generally classified into a dimer type and a tetramer type. In addition, the dimer type is further classified into three different types 1 to 3 as follows.

(Formula 9)

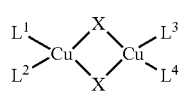

Dimer type 1

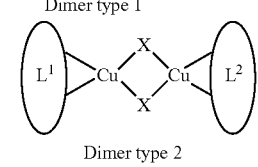

Dimer type 2

-continued

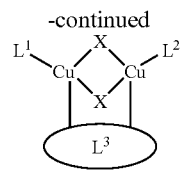

Dimer type 3

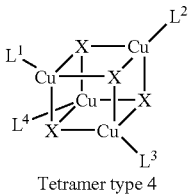

Tetramer type 4

In the above formulae, Cu represents a copper atom and $L^1$ to $L^4$ represents ligands, respectively, where the ligands are respectively monodentate ligands independent from each other or the ligands form a multidentate ligand in which two or more coordinating atoms are covalently bound together.

X in each of the above dimer types 1 and 2 represents an atomic group that contains a halogen, sulfur, or nitrogen atom. Two atoms or two atomic groups can cross-link a Cu atom. In addition, in the dimer type 1, a high-molecular coordination compound having any of these biding structural units can be formed. In this high-molecular copper coordination compound, X may be also an atomic group containing a halogen, sulfur, or nitrogen atom.

In addition, with respect to the above dimer type 3 and the tetramer type, X is a halogen atom. In the dimer type 3, an atomic group containing a sulfur or nitrogen atom cannot be configured in three dimensions as the L3 ligand interferes with such a configuration. In the tetramer type, three bonds extend from X. Thus, a halogen atom binds to those bonds to form a coordination structure, but a nitrogen or sulfur atom or an atomic group cannot bind to those bonds.

Concretely, the compounds classified in the above dimer type 1 include copper coordination compounds having any of the partial structural formulae represented by the following general formulae (2) and (3).

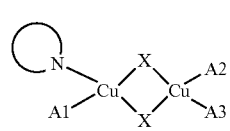

(2)

In the formula (2), Cu represents a copper ion; X represents an atomic group containing a halogen, sulfur, or nitrogen atom; N represents a nitrogen atom of an imine group in a cyclic group; and at least one of A1 to A3 is a ligand composed of an atomic group containing a carbon atom and may be covalently bound to another one.

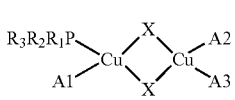

(3)

In the formula (3), Cu represents a copper ion; X represents an atomic group containing a halogen, sulfur, or nitrogen atom; P represents a phosphorus atom in a phosphine compound; $R_1$ to $R_3$ independently or identically represent a linear, branched, or cyclic alkyl group or an aromatic ring group which may have a substituent; and at least one of A1 to A3 is a ligand composed of an atomic group containing a carbon atom and may be covalently bound to another one.

In addition, concretely, the compounds classified in the above dimer type 2 include copper coordination compounds having any of the partial structural formulae represented by the following general formulae (4-1) to (4-5).

(4-1)

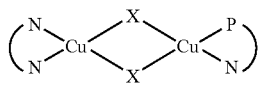
(4-2)

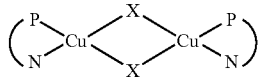
(4-3)

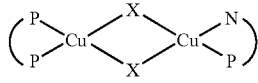
(4-4)

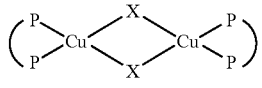
(4-5)

In the above formulae (4-1) to (4-5), Cu represents a copper ion; X represents an atomic group containing a halogen, sulfur, or nitrogen atom; and N—N, P—N, and P—P represent bidentate ligands in which each ligand has two coordinating atoms, where N—N contains two nitrogen atoms of an imine group, P—N contains one nitrogen atom of the imine group and one phosphorous atom, and P—P contains two phosphorous atoms.

In addition, concretely, the compounds classified in the above dimer type 3 include copper coordination compounds having any of the partial structural formulae represented by the following general formulae (5-1) to (5-3).

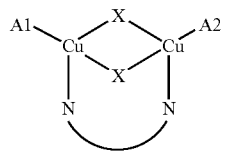
(5-1)

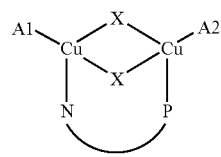
(5-2)

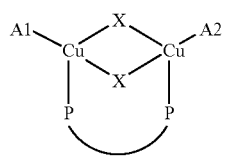
(5-3)

In the formulae (5-1) to (5-3), Cu represents a copper ion; X represents a halogen atom; N represents a nitrogen atom in an imine group; and P represents a phosphorus atom; N—N, P—N, and P—P represent multidentate ligands in which each ligand has two or more coordinating atoms, where N—N contains two nitrogen atoms of the imine group, P—N contains one nitrogen atom of the imine group and one phosphorous atom, and P—P contains two phosphorous atoms.

Furthermore, concretely, the compounds classified in the above tetramer type include copper coordination compounds having any of the partial structural formulae represented by the following general formulae (7) and (8), in which A1 and A2 each represent a ligand composed of an atomic group containing a carbon atom.

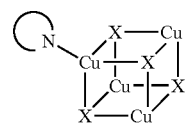
(7)

In the formula (7), Cu represents a copper ion; X represents a halogen atom; and N represents a nitrogen atom of an imine group in a cyclic group.

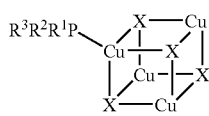
(8)

In the formula (8), Cu represents a copper ion; X represents a halogen atom; P represents a phosphorus atom in a phosphine compound; and $R^1$ to $R^3$ independently or identically represent a linear, branched, or cyclic alkyl group or an aromatic ring group which may have a substituent.

The ligand in the partial structural formula represented by each of the above general formulae (1) to (8) will be now described.

(1) Basic structural examples of an N—N ligand will be listed below.

(Formula 10)

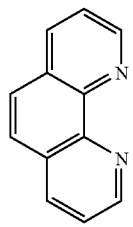
201

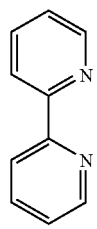
202

203 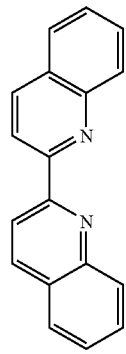
204 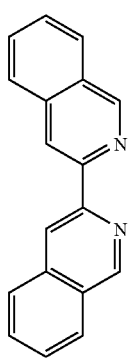
205 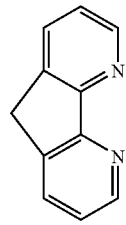
206 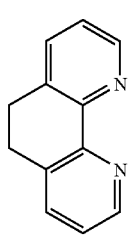
207 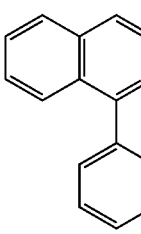
208 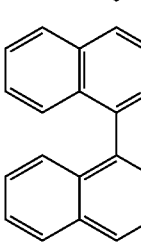
209 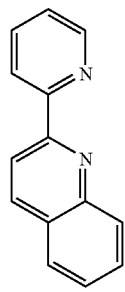
210 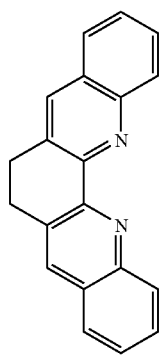
211 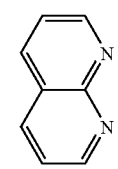
212 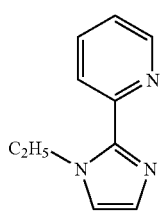
213 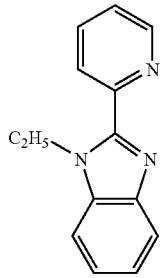
214 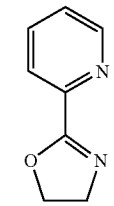

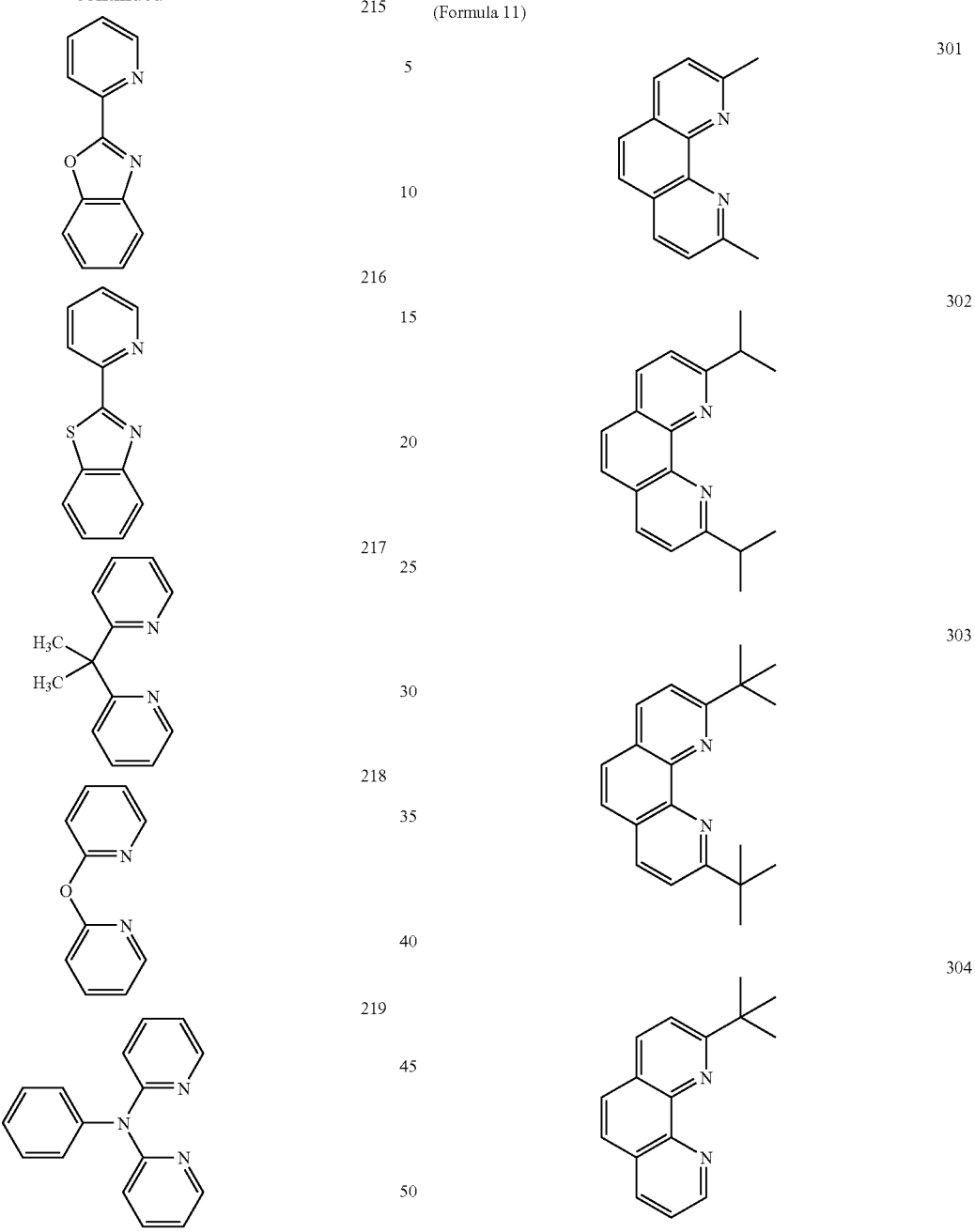

In the present invention, the N—N-ligand can be used without modification or after the addition of a substituent on the above structural formula. Each of the above basic structures may contain a condensed ring group or a substituent. The substituent may be a halogen atom, a linear, branched, or cyclic alkyl group, or an aromatic group which may have a substituent. A $CH_2$ group of the alkyl group may be substituted with —O— or —NR— (wherein R is an alkyl group or an aromatic ring group which may be substituted), and an H atom may be substituted with an aromatic ring group or a halogen atom.

The above N—N ligand contains two imine groups. Now, examples of ligands having substituents on their basic skeletons will be listed below.

-continued
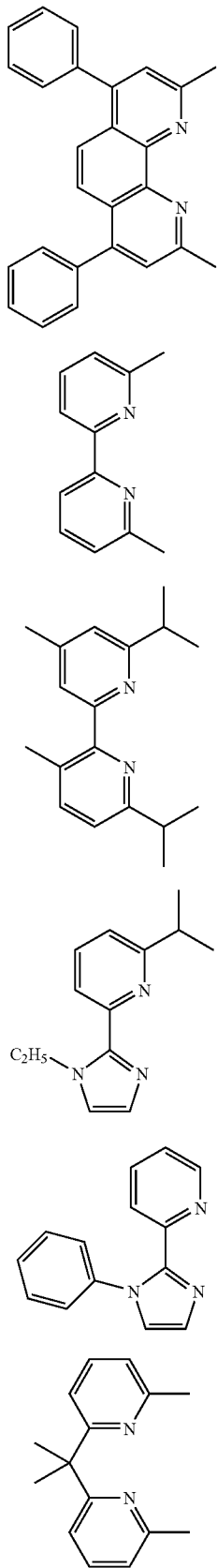
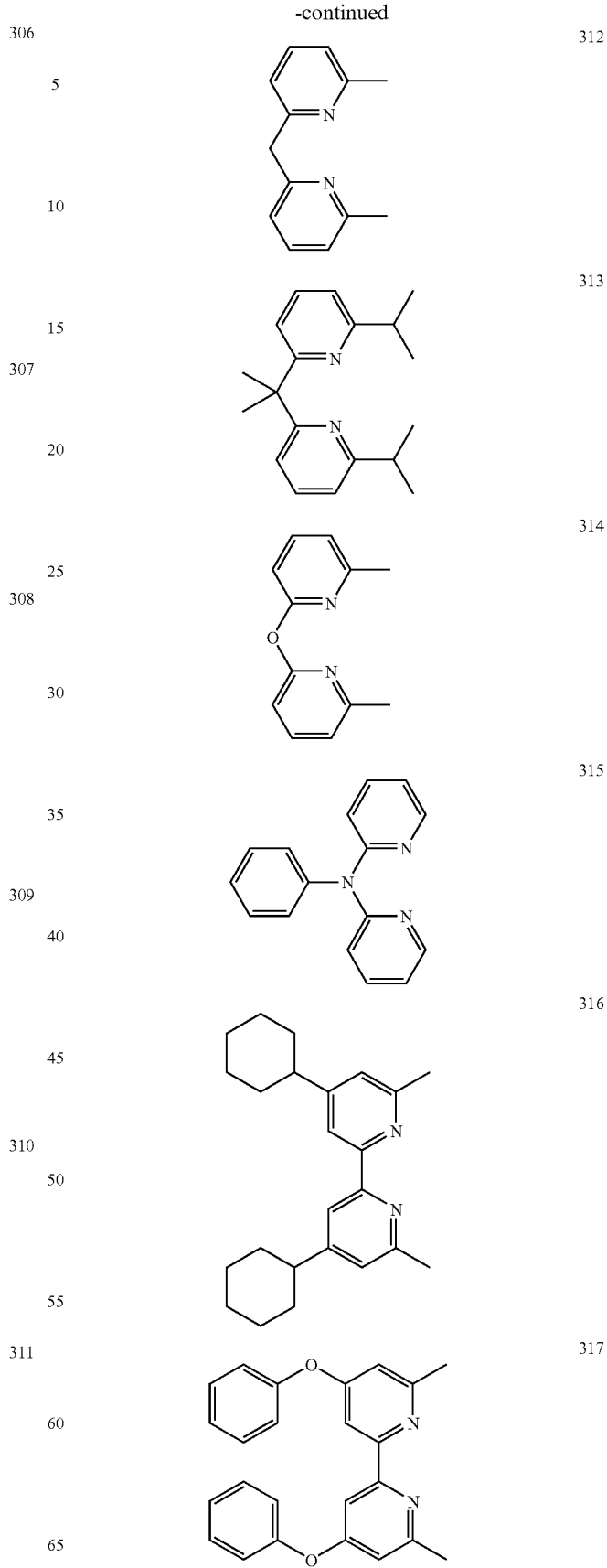

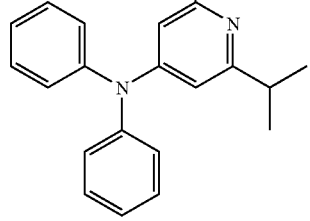
318
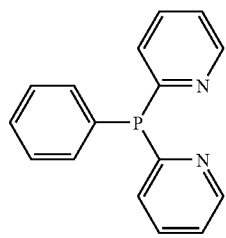
319
(2) Examples of the basic configuration of the P—N ligand will be listed below. The ligand contains one imine group and one phosphorus atom.
(Formula 12)
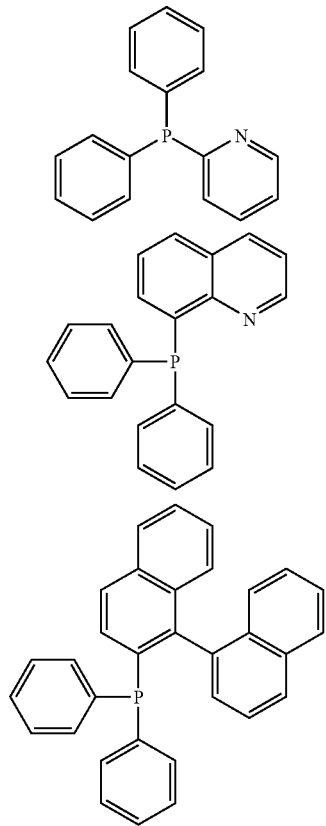
401
402
403
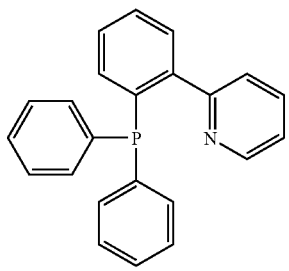
404
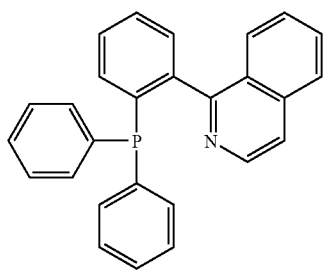
405
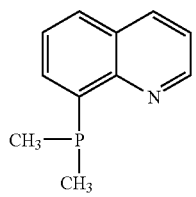
406
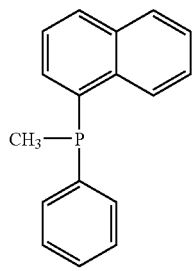
407
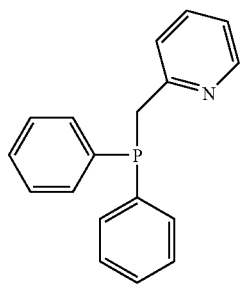
408
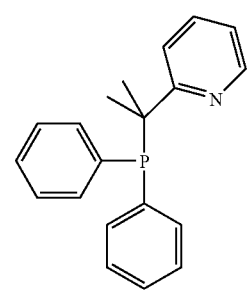
409

-continued
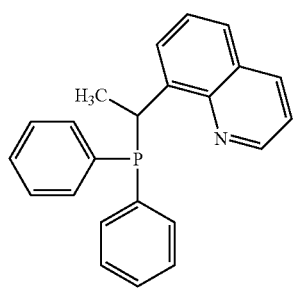
410
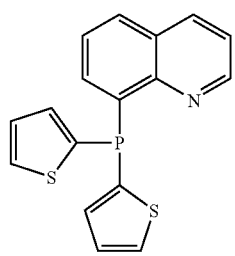
412
(3) Examples of the basic configuration of the P—P ligand will be listed below. The ligand contains two phosphorus atoms. In addition, the P—P ligand may have the same substituent as that of the N—N ligand mentioned in (1).
(Formula 13)
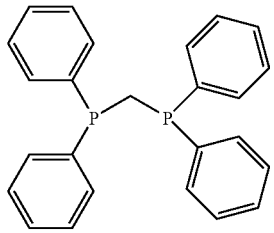
501
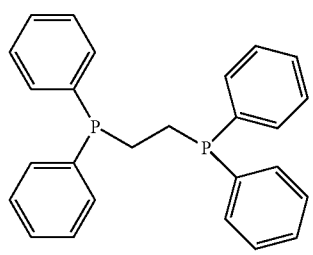
502
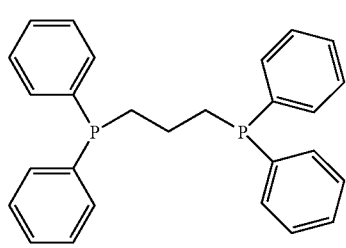
503
-continued
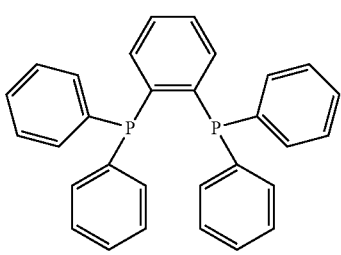
504
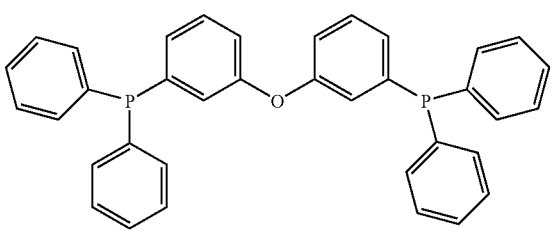
505
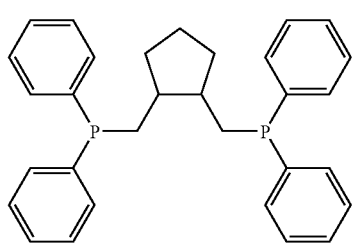
506
(4) Examples of an $R^3R^2R^1P$ ligand (monodentate ligand having one phosphorous atom) will be listed below.
(Formula 14)
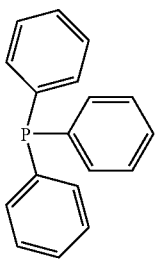
601
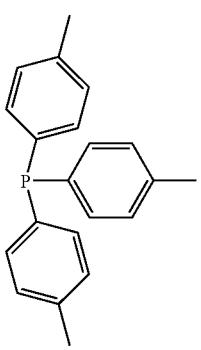
602

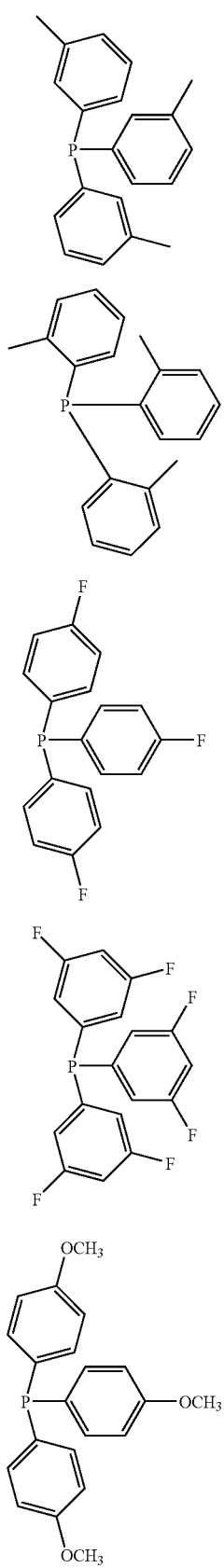
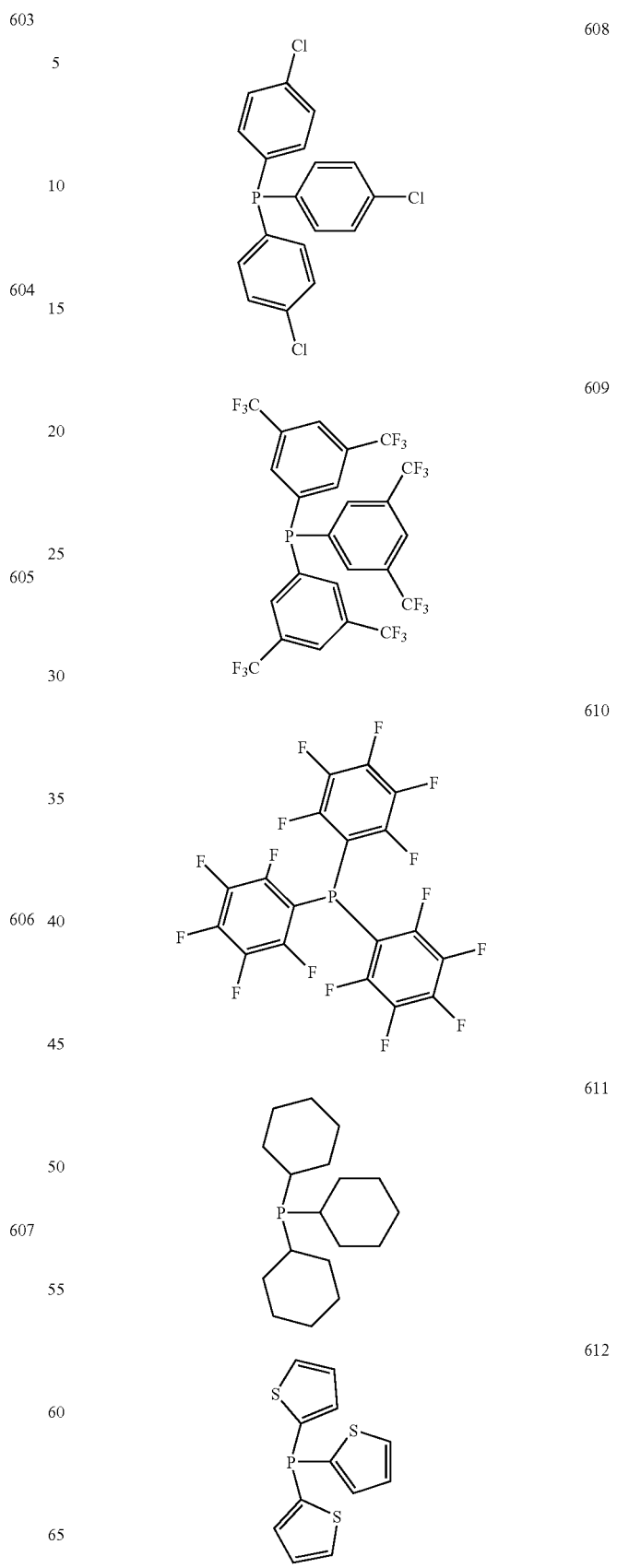

-continued
613 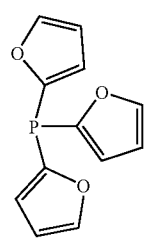
614 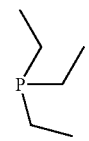
615 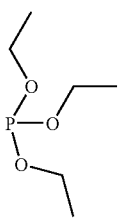
616 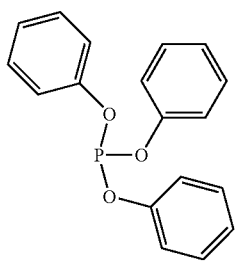
617 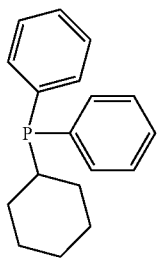
618 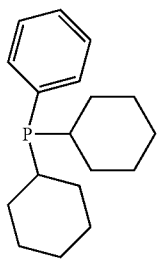
619 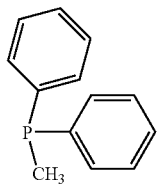
-continued
620 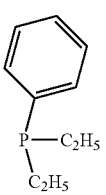
621 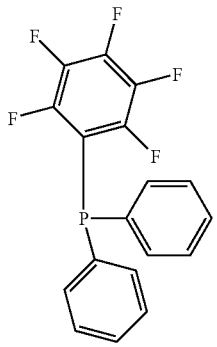
622 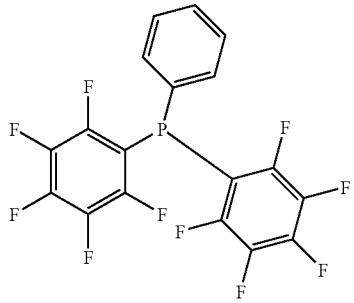
623 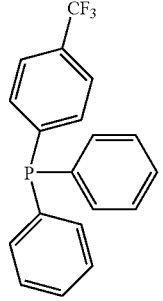
624 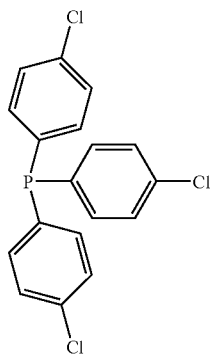

(5) Examples of a monodentate ligand having one nitrogen atom of an imine group in a cyclic group will be listed below.

(Formula 15)

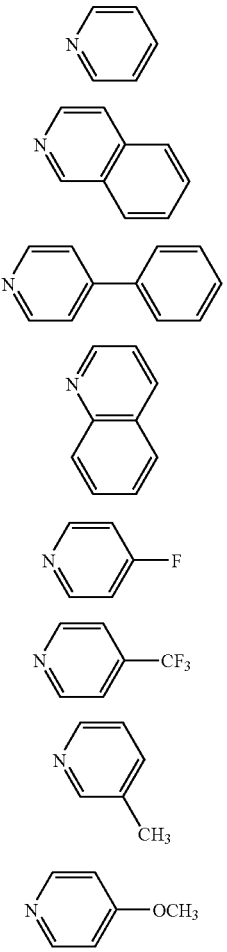

701
702
703
704
705
706
707
708

Furthermore, a high-molecular copper coordination compound as described below may be used in the present invention. In each of the following structural formulae, R represents one of alkyl, phenyl, aralkyl, and alkoxy groups.

(Formulae 16)

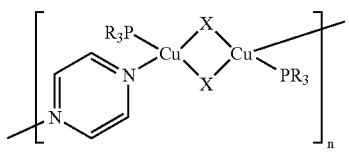

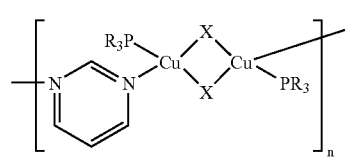

-continued

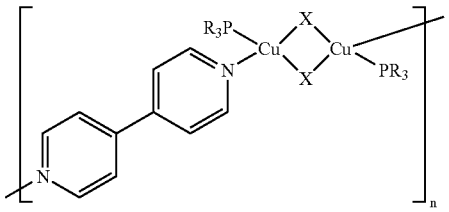

The high-molecular copper coordination compounds has a ligand having two imine groups in one molecule. In the formulae, X represents an atomic group containing a halogen, sulfur, or nitrogen atom. In the present invention, the high-molecular copper coordination compound refers to one having an average molecular weight of 3,000 or more. The high-molecular copper coordination compound may be suitably applied to a method in which such a compound is dissolved in a solvent and then subjected to the formation of a thin film by means of a spin coat method, inkjet method, or the like.

Furthermore, in the present invention, examples of the copper coordination compound where an atomic group containing a sulfur atom or a nitrogen atom as X of the dimer type 1 or 2 will be described below. In the following examples, the atomic group containing a nitrogen atom is a bidentate ligand containing a coordinate nitrogen atom. In the following structural formulae, Ph represents a phenyl group.

(Formulae 17)

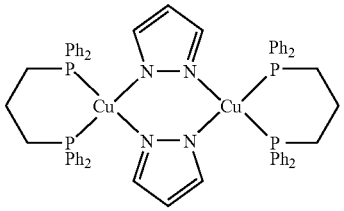

(Formulae 18)

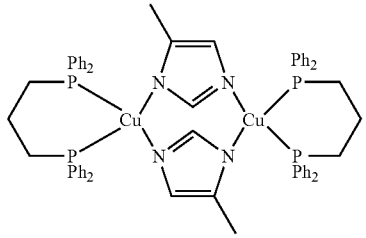

-continued

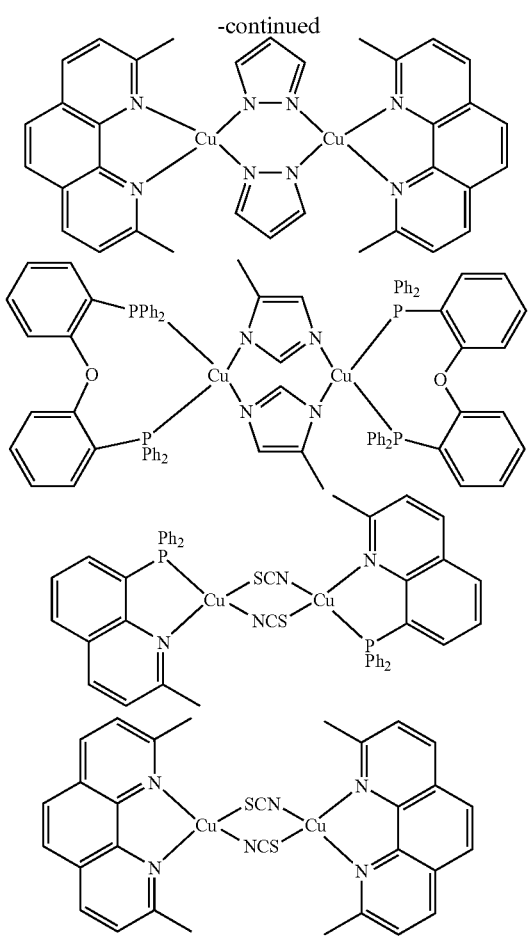

The copper coordination compound preferably used in the present invention is a non-ionic copper coordination compound which is electrically neutral. Thus, an ionic copper coordination compound requires a counter anion to be paired therewith. If they are employed in an organic EL device, they often hinder charge transport.

The configuration of the copper coordination compound can be determined using X-ray structure analysis.

The minimum excitation state of luminescence of the copper coordination compound to be used in the present invention may be one of the three different types described below, or may be a combined state thereof.

MLCT (metal-to-ligand-charge-transfer) excitation state

CC (cluster canter) excitation state

XLCT (halogen-to-ligand-charge-transfer) excitation state.

The contents of the excitation states are described in detail in Chemical Review, 1999, 99 p. 3625-3647. Even though it is difficult to specify each excitation state on each coordination compound, strong luminescence can be determined from the excitation state of the luminescence.

For attaining high luminescence efficiency, it is important to make the configuration of a ligand so as to prevent structural variations between the ground state and the excitation state. The coordination structure of Cu(I) is a pseudo-tetrahedral configuration having four coordination linkages. Higher luminescence is attained when the tetrahedral structure in the ground state is kept in the excitation state. For example, a phenanthroline ligand having two alkyl groups substituted at the positions 2 and 9 (N—N ligand having the chemical formulae 11: 301-308) has an advantage of retaining a pseudo-tetrahedral structure in the ground state even in the excitation state, thereby obtaining high luminescence property. Similarly in the case of a ligand having a pyridine ring, luminescence can be obtained more strongly when a hydrogen atom adjacent to a nitrogen atom is substituted with an alkyl group or the like. The tetrahedral structure, which tends to become a planar structure in the excitation state, retains a generally tetrahedral structure even in the excitation state by substituting with a bulky substituent.

The same holds true for a P—N ligand or P—P ligand, which contains a phosphorous atom, represented by the chemical formulae 12 or 13. In particular, an aromatic ring group bound to a phosphorous atom (for example, a phenyl, pyridine, or thienyl group) is very bulky, so that it will be effective in preventing flattening in the excitation manner.

In the copper coordination compound of the present invention, the above structural variations can be prevented in a solid rather than a solution, so that the copper coordination compound may provide strong luminescence. This is one of the reasons that the copper coordination compound in a solid state generates luminescence well.

Another reason is that the formation of an additional coordination structure occurs in a solution and the resulting structure may have the coordination number 5 which do not generate strong luminescence. Such a reaction of attaining the coordination number 5 is hardly obtained as a molecular movement is being restricted in a solid. Therefore, strong luminescence can be generated in a solid.

In addition, the powder solid of the copper coordination compound of the present invention has a luminescence lifetime of 0.05 to 50 μsec.

An aluminum quinolinol derivative, coumarin derivative, quinacridone derivative, or the like used until now allows the generation of very strong luminescence and retains its strong luminescence property in a solid dispersion without modification. This property also acts effectively in an organic EL device, thereby attaining high luminescence efficiency of the organic EL device.

However, the copper coordination compound used in the present invention shows very strong luminescence in a solid, compared with luminescence in a solution. The inventors of the present invention have considered the property of the copper coordination compound and found out that the copper coordination compound is useful as a light-emitting material of an organic EL device with high luminescence efficiency and stable luminescence.

The copper coordination compound used in the present invention is useful as a light-emitting material of an organic EL device. To say nothing of having high luminescence efficiency, the copper coordination compound is suitable for various kinds of coating methods including: a vacuum deposition process; a spin coat process in which the compound is prepared as a solution and then applied to; and a coating process with inkjet nozzles. Therefore, an organic EL device can be formed without causing any damage such as decomposition in a device production process.

Hereinafter, concrete examples of the copper coordination compound used in the present invention will be described.

TABLE 1

Dimer type 2

| Exemplified compound No. | L₁ | L₂ | X |
|---|---|---|---|
| 1001 | 301 | 301 | I |
| 1002 | 302 | 302 | I |
| 1003 | 303 | 303 | I |
| 1004 | 304 | 304 | I |
| 1005 | 305 | 305 | I |
| 1006 | 306 | 306 | I |
| 1007 | 307 | 307 | I |
| 1008 | 308 | 308 | I |
| 1009 | 309 | 309 | I |
| 1010 | 310 | 310 | I |
| 1011 | 311 | 311 | I |
| 1012 | 312 | 312 | I |
| 1013 | 313 | 313 | I |
| 1014 | 314 | 314 | I |
| 1015 | 315 | 315 | I |
| 1016 | 316 | 316 | I |
| 1017 | 317 | 317 | I |
| 1018 | 318 | 318 | I |
| 1019 | 401 | 401 | I |
| 1020 | 402 | 402 | I |
| 1021 | 403 | 403 | I |
| 1022 | 404 | 404 | I |
| 1023 | 405 | 405 | I |
| 1024 | 406 | 406 | I |
| 1025 | 407 | 407 | I |
| 1026 | 408 | 408 | I |
| 1027 | 409 | 409 | I |
| 1028 | 410 | 410 | I |
| 1029 | 411 | 411 | I |
| 1030 | 412 | 412 | I |
| 1031 | 501 | 501 | I |
| 1032 | 502 | 502 | I |
| 1033 | 503 | 503 | I |
| 1034 | 504 | 504 | I |
| 1035 | 505 | 505 | I |
| 1036 | 506 | 506 | I |
| 1037 | 301 | 403 | I |
| 1038 | 302 | 403 | I |
| 1039 | 303 | 403 | I |
| 1040 | 304 | 403 | I |
| 1041 | 305 | 403 | I |
| 1042 | 306 | 403 | I |
| 1043 | 307 | 403 | I |
| 1044 | 308 | 403 | I |
| 1045 | 309 | 403 | I |
| 1046 | 310 | 403 | I |
| 1047 | 311 | 403 | I |
| 1048 | 312 | 403 | I |
| 1049 | 313 | 403 | I |
| 1050 | 314 | 403 | I |
| 1051 | 315 | 403 | I |
| 1052 | 316 | 403 | I |
| 1053 | 317 | 403 | I |
| 1054 | 318 | 403 | I |
| 1055 | 401 | 403 | I |
| 1056 | 402 | 403 | I |
| 1057 | 403 | 403 | I |
| 1058 | 404 | 403 | I |
| 1059 | 405 | 403 | I |
| 1060 | 406 | 403 | I |
| 1061 | 407 | 403 | I |
| 1062 | 408 | 403 | I |
| 1063 | 409 | 403 | I |
| 1064 | 410 | 403 | I |
| 1065 | 411 | 403 | I |
| 1066 | 412 | 403 | I |
| 1067 | 301 | 503 | I |
| 1068 | 302 | 503 | I |
| 1069 | 303 | 503 | I |
| 1070 | 304 | 503 | I |
| 1071 | 305 | 503 | I |
| 1072 | 306 | 503 | I |
| 1073 | 307 | 503 | I |
| 1074 | 308 | 503 | I |
| 1075 | 309 | 503 | I |
| 1076 | 310 | 503 | I |
| 1077 | 311 | 503 | I |
| 1078 | 312 | 503 | I |
| 1079 | 313 | 503 | I |
| 1080 | 314 | 503 | I |
| 1081 | 315 | 503 | I |
| 1082 | 316 | 503 | I |
| 1083 | 317 | 503 | I |
| 1084 | 318 | 503 | I |
| 1085 | 401 | 503 | I |
| 1086 | 402 | 503 | I |
| 1087 | 403 | 503 | I |
| 1088 | 404 | 503 | I |
| 1089 | 405 | 503 | I |
| 1090 | 406 | 503 | I |
| 1091 | 407 | 503 | I |
| 1092 | 408 | 503 | I |
| 1093 | 409 | 503 | I |
| 1094 | 410 | 503 | I |
| 1095 | 411 | 503 | I |
| 1096 | 412 | 503 | I |
| 1097 | 301 | 504 | I |
| 1098 | 302 | 504 | I |
| 1099 | 303 | 504 | I |
| 1100 | 304 | 504 | I |
| 1101 | 305 | 504 | I |
| 1102 | 306 | 504 | I |
| 1103 | 307 | 504 | I |
| 1104 | 308 | 504 | I |
| 1105 | 309 | 504 | I |
| 1106 | 310 | 504 | I |
| 1107 | 311 | 504 | I |
| 1108 | 312 | 504 | I |
| 1109 | 313 | 504 | I |
| 1110 | 314 | 504 | I |
| 1111 | 315 | 504 | I |
| 1112 | 316 | 504 | I |
| 1113 | 317 | 504 | I |
| 1114 | 318 | 504 | I |
| 1115 | 401 | 504 | I |
| 1116 | 402 | 504 | I |
| 1117 | 403 | 504 | I |
| 1118 | 404 | 504 | I |
| 1119 | 405 | 504 | I |
| 1120 | 406 | 504 | I |
| 1121 | 407 | 504 | I |
| 1122 | 408 | 504 | I |
| 1123 | 409 | 504 | I |
| 1124 | 410 | 504 | I |
| 1125 | 411 | 504 | I |
| 1126 | 412 | 504 | I |
| 1127 | 301 | 301 | Br |
| 1128 | 302 | 302 | Br |
| 1129 | 303 | 303 | Br |
| 1130 | 304 | 304 | Br |
| 1131 | 305 | 305 | Br |
| 1132 | 306 | 306 | Br |
| 1133 | 307 | 307 | Br |
| 1134 | 308 | 308 | Br |
| 1135 | 309 | 309 | Br |
| 1136 | 310 | 310 | Br |
| 1137 | 311 | 311 | Br |
| 1138 | 312 | 312 | Br |
| 1139 | 313 | 313 | Br |
| 1140 | 314 | 314 | Br |
| 1141 | 315 | 315 | Br |
| 1142 | 316 | 316 | Br |
| 1143 | 317 | 317 | Br |
| 1144 | 318 | 318 | Br |
| 1145 | 401 | 401 | Br |
| 1146 | 402 | 402 | Br |

TABLE 1-continued

Dimer type 2

| Exemplified compound No. | L₁ | L₂ | X |
|---|---|---|---|
| 1147 | 403 | 403 | Br |
| 1148 | 404 | 404 | Br |
| 1149 | 405 | 405 | Br |
| 1150 | 406 | 406 | Br |
| 1151 | 407 | 407 | Br |
| 1152 | 408 | 408 | Br |
| 1153 | 409 | 409 | Br |
| 1154 | 410 | 410 | Br |
| 1155 | 411 | 411 | Br |
| 1156 | 412 | 412 | Br |
| 1157 | 501 | 501 | Br |
| 1158 | 502 | 502 | Br |
| 1159 | 503 | 503 | Br |
| 1160 | 504 | 504 | Br |
| 1161 | 505 | 505 | Br |
| 1162 | 506 | 506 | Br |
| 1163 | 301 | 403 | Br |
| 1164 | 302 | 403 | Br |
| 1165 | 303 | 403 | Br |
| 1166 | 304 | 403 | Br |
| 1167 | 305 | 403 | Br |
| 1168 | 306 | 403 | Br |
| 1169 | 307 | 403 | Br |
| 1170 | 308 | 403 | Br |
| 1171 | 309 | 403 | Br |
| 1172 | 310 | 403 | Br |
| 1173 | 311 | 403 | Br |
| 1174 | 312 | 403 | Br |
| 1175 | 313 | 403 | Br |
| 1176 | 314 | 403 | Br |
| 1177 | 315 | 403 | Br |
| 1178 | 316 | 403 | Br |
| 1179 | 317 | 403 | Br |
| 1180 | 318 | 403 | Br |
| 1181 | 401 | 403 | Br |
| 1182 | 402 | 403 | Br |
| 1183 | 403 | 403 | Br |
| 1184 | 404 | 403 | Br |
| 1185 | 405 | 403 | Br |
| 1186 | 406 | 403 | Br |
| 1187 | 407 | 403 | Br |
| 1188 | 408 | 403 | Br |
| 1189 | 409 | 403 | Br |
| 1190 | 410 | 403 | Br |
| 1191 | 411 | 403 | Br |
| 1192 | 412 | 403 | Br |
| 1193 | 301 | 503 | Br |
| 1194 | 302 | 503 | Br |
| 1195 | 303 | 503 | Br |
| 1196 | 304 | 503 | Br |
| 1197 | 305 | 503 | Br |
| 1198 | 306 | 503 | Br |
| 1199 | 307 | 503 | Br |
| 1200 | 308 | 503 | Br |
| 1201 | 309 | 503 | Br |
| 1202 | 310 | 503 | Br |
| 1203 | 311 | 503 | Br |
| 1204 | 312 | 503 | Br |
| 1205 | 313 | 503 | Br |
| 1206 | 314 | 503 | Br |
| 1207 | 315 | 503 | Br |
| 1208 | 316 | 503 | Br |
| 1209 | 317 | 503 | Br |
| 1210 | 318 | 503 | Br |
| 1211 | 401 | 503 | Br |
| 1212 | 402 | 503 | Br |
| 1213 | 403 | 503 | Br |
| 1214 | 404 | 503 | Br |
| 1215 | 405 | 503 | Br |
| 1216 | 406 | 503 | Br |
| 1217 | 407 | 503 | Br |
| 1218 | 408 | 503 | Br |
| 1219 | 409 | 503 | Br |

TABLE 1-continued

Dimer type 2

| Exemplified compound No. | L₁ | L₂ | X |
|---|---|---|---|
| 1220 | 410 | 503 | Br |
| 1221 | 411 | 503 | Br |
| 1222 | 412 | 503 | Br |
| 1223 | 301 | 504 | Br |
| 1224 | 302 | 504 | Br |
| 1225 | 303 | 504 | Br |
| 1226 | 304 | 504 | Br |
| 1227 | 305 | 504 | Br |
| 1228 | 306 | 504 | Br |
| 1229 | 307 | 504 | Br |
| 1230 | 308 | 504 | Br |
| 1231 | 309 | 504 | Br |
| 1232 | 310 | 504 | Br |
| 1233 | 311 | 504 | Br |
| 1234 | 312 | 504 | Br |
| 1235 | 313 | 504 | Br |
| 1236 | 314 | 504 | Br |
| 1237 | 315 | 504 | Br |
| 1238 | 316 | 504 | Br |
| 1239 | 317 | 504 | Br |
| 1240 | 318 | 504 | Br |
| 1241 | 401 | 504 | Br |
| 1242 | 402 | 504 | Br |
| 1243 | 403 | 504 | Br |
| 1244 | 404 | 504 | Br |
| 1245 | 405 | 504 | Br |
| 1246 | 406 | 504 | Br |
| 1247 | 407 | 504 | Br |
| 1248 | 408 | 504 | Br |
| 1249 | 409 | 504 | Br |
| 1250 | 410 | 504 | Br |
| 1251 | 411 | 504 | Br |
| 1252 | 412 | 504 | Br |
| 1253 | 504 | 504 | Cl |

TABLE 2

Dimer type 1

| Exemplified compound No. | L₁ = L₃ | L₂ = L₄ | X |
|---|---|---|---|
| 2001 | 601 | 701 | I |
| 2002 | 602 | 701 | I |
| 2003 | 603 | 701 | I |
| 2004 | 604 | 701 | I |
| 2005 | 605 | 701 | I |
| 2006 | 606 | 701 | I |
| 2007 | 607 | 701 | I |
| 2008 | 608 | 701 | I |
| 2009 | 609 | 701 | I |
| 2010 | 610 | 701 | I |
| 2011 | 611 | 701 | I |
| 2012 | 612 | 701 | I |
| 2013 | 613 | 701 | I |
| 2014 | 614 | 701 | I |
| 2015 | 615 | 701 | I |
| 2016 | 616 | 701 | I |
| 2017 | 617 | 701 | I |
| 2018 | 618 | 701 | I |
| 2019 | 619 | 701 | I |
| 2020 | 620 | 701 | I |
| 2021 | 621 | 701 | I |
| 2022 | 622 | 701 | I |
| 2023 | 623 | 701 | I |
| 2024 | 624 | 701 | I |
| 2025 | 601 | 702 | I |
| 2026 | 601 | 703 | I |
| 2027 | 601 | 704 | I |

TABLE 2-continued

Dimer type 1

| Exemplified compound No. | $L_1 = L_3$ | $L_2 = L_4$ | X |
|---|---|---|---|
| 2028 | 601 | 705 | I |
| 2029 | 601 | 706 | I |
| 2030 | 601 | 707 | I |
| 2031 | 601 | 708 | I |
| 2032 | 601 | 709 | I |
| 2033 | 601 | 710 | I |
| 2034 | 602 | 705 | I |
| 2035 | 603 | 705 | I |
| 2036 | 604 | 705 | I |
| 2037 | 605 | 705 | I |
| 2038 | 606 | 705 | I |
| 2039 | 607 | 705 | I |
| 2040 | 608 | 705 | I |
| 2041 | 609 | 705 | I |
| 2042 | 610 | 705 | I |
| 2043 | 611 | 705 | I |
| 2044 | 612 | 705 | I |
| 2045 | 613 | 705 | I |
| 2046 | 614 | 705 | I |
| 2047 | 615 | 705 | I |
| 2048 | 616 | 705 | I |
| 2049 | 617 | 705 | I |
| 2050 | 618 | 705 | I |
| 2051 | 619 | 705 | I |
| 2052 | 620 | 705 | I |
| 2053 | 621 | 705 | I |
| 2054 | 622 | 705 | I |
| 2055 | 623 | 705 | I |
| 2056 | 624 | 705 | I |

TABLE 3

Dimer type 3

| Exemplified compound No. | $L_1 = L_2$ | $L_3$ | X |
|---|---|---|---|
| 3001 | 601 | 201 | I |
| 3002 | 602 | 201 | I |
| 3003 | 603 | 201 | I |
| 3004 | 604 | 201 | I |
| 3005 | 605 | 201 | I |
| 3006 | 606 | 201 | I |
| 3007 | 607 | 201 | I |
| 3008 | 608 | 201 | I |
| 3009 | 609 | 201 | I |
| 3010 | 610 | 201 | I |
| 3011 | 611 | 201 | I |
| 3012 | 612 | 201 | I |
| 3013 | 613 | 201 | I |
| 3014 | 614 | 201 | I |
| 3015 | 615 | 201 | I |
| 3016 | 616 | 201 | I |
| 3017 | 617 | 201 | I |
| 3018 | 618 | 201 | I |
| 3019 | 619 | 201 | I |
| 3020 | 620 | 201 | I |
| 3021 | 621 | 201 | I |
| 3022 | 622 | 201 | I |
| 3023 | 623 | 201 | I |
| 3024 | 624 | 201 | I |
| 3025 | 601 | 202 | I |
| 3026 | 602 | 202 | I |
| 3027 | 603 | 202 | I |
| 3028 | 604 | 202 | I |
| 3029 | 605 | 202 | I |
| 3030 | 606 | 202 | I |
| 3031 | 607 | 202 | I |
| 3032 | 608 | 202 | I |

TABLE 3-continued

Dimer type 3

| Exemplified compound No. | $L_1 = L_2$ | $L_3$ | X |
|---|---|---|---|
| 3033 | 609 | 202 | I |
| 3034 | 610 | 202 | I |
| 3035 | 611 | 202 | I |
| 3036 | 612 | 202 | I |
| 3037 | 613 | 202 | I |
| 3038 | 614 | 202 | I |
| 3039 | 615 | 202 | I |
| 3040 | 616 | 202 | I |
| 3041 | 617 | 202 | I |
| 3042 | 618 | 202 | I |
| 3043 | 619 | 202 | I |
| 3044 | 620 | 202 | I |
| 3045 | 621 | 202 | I |
| 3046 | 622 | 202 | I |
| 3047 | 623 | 202 | I |
| 3048 | 624 | 202 | I |
| 3049 | 601 | 211 | I |
| 3050 | 602 | 211 | I |
| 3051 | 603 | 211 | I |
| 3052 | 604 | 211 | I |
| 3053 | 605 | 211 | I |
| 3054 | 606 | 211 | I |
| 3055 | 607 | 211 | I |
| 3056 | 608 | 211 | I |
| 3057 | 609 | 211 | I |
| 3058 | 610 | 211 | I |
| 3059 | 611 | 211 | I |
| 3060 | 612 | 211 | I |
| 3061 | 613 | 211 | I |
| 3062 | 614 | 211 | I |
| 3063 | 615 | 211 | I |
| 3064 | 616 | 211 | I |
| 3065 | 617 | 211 | I |
| 3066 | 618 | 211 | I |
| 3067 | 619 | 211 | I |
| 3068 | 620 | 211 | I |
| 3069 | 621 | 211 | I |
| 3070 | 622 | 211 | I |
| 3071 | 623 | 211 | I |
| 3072 | 624 | 211 | I |
| 3073 | 701 | 501 | I |
| 3074 | 702 | 501 | I |
| 3075 | 703 | 501 | I |
| 3076 | 704 | 501 | I |
| 3077 | 705 | 501 | I |
| 3078 | 706 | 501 | I |
| 3079 | 707 | 501 | I |
| 3080 | 708 | 501 | I |
| 3081 | 601 | 401 | I |
| 3082 | 602 | 401 | I |
| 3083 | 603 | 401 | I |
| 3084 | 604 | 401 | I |
| 3085 | 605 | 401 | I |
| 3086 | 606 | 401 | I |
| 3087 | 607 | 401 | I |
| 3088 | 608 | 401 | I |
| 3089 | 609 | 401 | I |
| 3090 | 610 | 401 | I |
| 3091 | 611 | 401 | I |
| 3092 | 612 | 401 | I |
| 3093 | 613 | 401 | I |
| 3094 | 614 | 401 | I |
| 3095 | 615 | 401 | I |
| 3096 | 616 | 401 | I |
| 3097 | 617 | 401 | I |
| 3098 | 618 | 401 | I |
| 3099 | 619 | 401 | I |
| 3100 | 620 | 401 | I |
| 3101 | 621 | 401 | I |
| 3102 | 622 | 401 | I |
| 3103 | 623 | 401 | I |
| 3104 | 624 | 401 | I |
| 3105 | 701 | 401 | I |

TABLE 3-continued

Dimer type 3

| Exemplified compound No. | $L_1 = L_2$ | $L_3$ | X |
|---|---|---|---|
| 3106 | 702 | 401 | I |
| 3107 | 703 | 401 | I |
| 3108 | 704 | 401 | I |
| 3109 | 705 | 401 | I |
| 3110 | 706 | 401 | I |
| 3111 | 707 | 401 | I |
| 3112 | 708 | 401 | I |
| 3113 | 601 | 201 | Br |
| 3114 | 602 | 201 | Br |
| 3115 | 603 | 201 | Br |
| 3116 | 604 | 201 | Br |
| 3117 | 605 | 201 | Br |
| 3118 | 606 | 201 | Br |
| 3119 | 607 | 201 | Br |
| 3120 | 608 | 201 | Br |
| 3121 | 609 | 201 | Br |
| 3122 | 610 | 201 | Br |
| 3123 | 611 | 201 | Br |
| 3124 | 612 | 201 | Br |
| 3125 | 613 | 201 | Br |
| 3126 | 614 | 201 | Br |
| 3127 | 615 | 201 | Br |
| 3128 | 616 | 201 | Br |
| 3129 | 617 | 201 | Br |
| 3130 | 618 | 201 | Br |
| 3131 | 619 | 201 | Br |
| 3132 | 620 | 201 | Br |
| 3133 | 621 | 201 | Br |
| 3134 | 622 | 201 | Br |
| 3135 | 623 | 201 | Br |
| 3136 | 624 | 201 | Br |
| 3137 | 601 | 202 | Br |
| 3138 | 602 | 202 | Br |
| 3139 | 603 | 202 | Br |
| 3140 | 604 | 202 | Br |
| 3141 | 605 | 202 | Br |
| 3142 | 606 | 202 | Br |
| 3143 | 607 | 202 | Br |
| 3144 | 608 | 202 | Br |
| 3145 | 609 | 202 | Br |
| 3146 | 610 | 202 | Br |
| 3147 | 611 | 202 | Br |
| 3148 | 612 | 202 | Br |
| 3149 | 613 | 202 | Br |
| 3150 | 614 | 202 | Br |
| 3151 | 615 | 202 | Br |
| 3152 | 616 | 202 | Br |
| 3153 | 617 | 202 | Br |
| 3154 | 618 | 202 | Br |
| 3155 | 619 | 202 | Br |
| 3156 | 620 | 202 | Br |
| 3157 | 621 | 202 | Br |
| 3158 | 622 | 202 | Br |
| 3159 | 623 | 202 | Br |
| 3160 | 624 | 202 | Br |
| 3161 | 601 | 211 | Br |
| 3162 | 602 | 211 | Br |
| 3163 | 603 | 211 | Br |
| 3164 | 604 | 211 | Br |
| 3165 | 605 | 211 | Br |
| 3166 | 606 | 211 | Br |
| 3167 | 607 | 211 | Br |
| 3168 | 608 | 211 | Br |
| 3169 | 609 | 211 | Br |
| 3170 | 610 | 211 | Br |
| 3171 | 611 | 211 | Br |
| 3172 | 612 | 211 | Br |
| 3173 | 613 | 211 | Br |
| 3174 | 614 | 211 | Br |
| 3175 | 615 | 211 | Br |
| 3176 | 616 | 211 | Br |
| 3177 | 617 | 211 | Br |
| 3178 | 618 | 211 | Br |
| 3179 | 619 | 211 | Br |
| 3180 | 620 | 211 | Br |
| 3181 | 621 | 211 | Br |
| 3182 | 622 | 211 | Br |
| 3183 | 623 | 211 | Br |
| 3184 | 624 | 211 | Br |
| 3185 | 701 | 501 | Br |
| 3186 | 702 | 501 | Br |
| 3187 | 703 | 501 | Br |
| 3188 | 704 | 501 | Br |
| 3189 | 705 | 501 | Br |
| 3190 | 706 | 501 | Br |
| 3191 | 707 | 501 | Br |
| 3192 | 708 | 501 | Br |
| 3193 | 601 | 401 | Br |
| 3194 | 602 | 401 | Br |
| 3195 | 603 | 401 | Br |
| 3196 | 604 | 401 | Br |
| 3197 | 605 | 401 | Br |
| 3198 | 606 | 401 | Br |
| 3199 | 607 | 401 | Br |
| 3200 | 608 | 401 | Br |
| 3201 | 609 | 401 | Br |
| 3202 | 610 | 401 | Br |
| 3203 | 611 | 401 | Br |
| 3204 | 612 | 401 | Br |
| 3205 | 613 | 401 | Br |
| 3206 | 614 | 401 | Br |
| 3207 | 615 | 401 | Br |
| 3208 | 616 | 401 | Br |
| 3209 | 617 | 401 | Br |
| 3210 | 618 | 401 | Br |
| 3211 | 619 | 401 | Br |
| 3212 | 620 | 401 | Br |
| 3213 | 621 | 401 | Br |
| 3214 | 622 | 401 | Br |
| 3215 | 623 | 401 | Br |
| 3216 | 624 | 401 | Br |
| 3217 | 701 | 401 | Br |
| 3218 | 702 | 401 | Br |
| 3219 | 703 | 401 | Br |
| 3220 | 704 | 401 | Br |
| 3221 | 705 | 401 | Br |
| 3222 | 706 | 401 | Br |
| 3223 | 707 | 401 | Br |
| 3224 | 708 | 401 | Br |
| 3225 | 601 | 201 | Cl |
| 3226 | 602 | 201 | Cl |
| 3227 | 603 | 201 | Cl |
| 3228 | 604 | 201 | Cl |
| 3229 | 605 | 201 | Cl |
| 3230 | 606 | 201 | Cl |
| 3231 | 607 | 201 | Cl |
| 3232 | 608 | 201 | Cl |
| 3233 | 609 | 201 | Cl |
| 3234 | 610 | 201 | Cl |
| 3235 | 611 | 201 | Cl |
| 3236 | 612 | 201 | Cl |
| 3244 | 620 | 201 | Cl |
| 3245 | 621 | 201 | Cl |
| 3246 | 622 | 201 | Cl |
| 3247 | 623 | 201 | Cl |
| 3248 | 624 | 201 | Cl |
| 3249 | 601 | 202 | Cl |
| 3250 | 602 | 202 | Cl |
| 3251 | 603 | 202 | Cl |
| 3252 | 604 | 202 | Cl |
| 3253 | 605 | 202 | Cl |
| 3262 | 614 | 202 | Cl |
| 3263 | 615 | 202 | Cl |
| 3264 | 616 | 202 | Cl |
| 3265 | 617 | 202 | Cl |
| 3266 | 618 | 202 | Cl |

TABLE 3-continued

Dimer type 3

| Exemplified compound No. | $L_1 = L_2$ | $L_3$ | X |
|---|---|---|---|
| 3267 | 619 | 202 | Cl |
| 3268 | 620 | 202 | Cl |
| 3269 | 621 | 202 | Cl |
| 3270 | 622 | 202 | Cl |
| 3271 | 623 | 202 | Cl |
| 3272 | 624 | 202 | Cl |
| 3273 | 601 | 211 | Cl |
| 3274 | 602 | 211 | Cl |
| 3275 | 603 | 211 | Cl |
| 3276 | 604 | 211 | Cl |
| 3277 | 605 | 211 | Cl |
| 3278 | 606 | 211 | Cl |
| 3279 | 607 | 211 | Cl |
| 3280 | 608 | 211 | Cl |
| 3281 | 609 | 211 | Cl |
| 3282 | 610 | 211 | Cl |
| 3283 | 611 | 211 | Cl |
| 3284 | 612 | 211 | Cl |
| 3285 | 613 | 211 | Cl |
| 3286 | 614 | 211 | Cl |
| 3287 | 615 | 211 | Cl |
| 3288 | 616 | 211 | Cl |
| 3289 | 617 | 211 | Cl |
| 3290 | 618 | 211 | Cl |
| 3291 | 619 | 211 | Cl |
| 3292 | 620 | 211 | Cl |
| 3293 | 621 | 211 | Cl |
| 3294 | 622 | 211 | Cl |
| 3295 | 623 | 211 | Cl |
| 3296 | 624 | 211 | Cl |
| 3297 | 701 | 501 | Cl |
| 3298 | 702 | 501 | Cl |
| 3299 | 703 | 501 | Cl |
| 3300 | 704 | 501 | Cl |
| 3301 | 705 | 501 | Cl |
| 3302 | 706 | 501 | Cl |
| 3303 | 707 | 501 | Cl |
| 3304 | 708 | 501 | Cl |
| 3305 | 601 | 401 | Cl |
| 3306 | 602 | 401 | Cl |
| 3307 | 603 | 401 | Cl |
| 3308 | 604 | 401 | Cl |
| 3309 | 605 | 401 | Cl |
| 3310 | 606 | 401 | Cl |
| 3311 | 607 | 401 | Cl |
| 3312 | 608 | 401 | Cl |
| 3313 | 609 | 401 | Cl |
| 3315 | 611 | 401 | Cl |
| 3316 | 612 | 401 | Cl |
| 3317 | 613 | 401 | Cl |
| 3318 | 614 | 401 | Cl |
| 3319 | 615 | 401 | Cl |
| 3320 | 616 | 401 | Cl |
| 3321 | 617 | 401 | Cl |
| 3322 | 618 | 401 | Cl |
| 3323 | 619 | 401 | Cl |
| 3324 | 620 | 401 | Cl |
| 3325 | 621 | 401 | Cl |

TABLE 4

Tetramer type

| Exemplified compound No. | $L_1 = L_2 = L_3 = L_4$ | X |
|---|---|---|
| 4001 | 601 | I |
| 4002 | 602 | I |
| 4003 | 603 | I |

TABLE 4-continued

Tetramer type

| Exemplified compound No. | $L_1 = L_2 = L_3 = L_4$ | X |
|---|---|---|
| 4004 | 604 | I |
| 4005 | 605 | I |
| 4006 | 606 | I |
| 4007 | 607 | I |
| 4008 | 608 | I |
| 4009 | 609 | I |
| 4010 | 610 | I |
| 4011 | 611 | I |
| 4012 | 612 | I |
| 4013 | 613 | I |
| 4014 | 614 | I |
| 4015 | 615 | I |
| 4016 | 616 | I |
| 4017 | 617 | I |
| 4018 | 618 | I |
| 4019 | 619 | I |
| 4020 | 620 | I |
| 4021 | 621 | I |
| 4022 | 622 | I |
| 4023 | 623 | I |
| 4024 | 624 | I |
| 4025 | 701 | I |
| 4026 | 702 | I |
| 4027 | 703 | I |
| 4028 | 704 | I |
| 4029 | 705 | I |
| 4030 | 706 | I |
| 4031 | 707 | I |
| 4032 | 708 | I |
| 4033 | 601 | Br |
| 4034 | 602 | Br |
| 4035 | 603 | Br |
| 4036 | 604 | Br |
| 4037 | 605 | Br |
| 4038 | 606 | Br |
| 4039 | 607 | Br |
| 4040 | 608 | Br |
| 4041 | 609 | Br |
| 4042 | 610 | Br |
| 4043 | 611 | Br |
| 4044 | 612 | Br |
| 4045 | 613 | Br |
| 4046 | 614 | Br |
| 4047 | 615 | Br |
| 4048 | 616 | Br |
| 4049 | 617 | Br |
| 4050 | 618 | Br |
| 4051 | 619 | Br |
| 4052 | 620 | Br |
| 4053 | 621 | Br |
| 4054 | 622 | Br |
| 4055 | 623 | Br |
| 4056 | 624 | Br |
| 4057 | 701 | Br |
| 4058 | 702 | Br |
| 4059 | 703 | Br |
| 4060 | 704 | Br |
| 4061 | 705 | Br |
| 4062 | 706 | Br |
| 4063 | 707 | Br |
| 4064 | 708 | Br |
| 4065 | 601 | Cl |
| 4066 | 602 | Cl |
| 4067 | 603 | Cl |
| 4068 | 604 | Cl |
| 4069 | 605 | Cl |
| 4070 | 606 | Cl |
| 4071 | 607 | Cl |
| 4072 | 608 | Cl |
| 4073 | 609 | Cl |
| 4074 | 610 | Cl |
| 4075 | 611 | Cl |
| 4076 | 612 | Cl |

TABLE 4-continued

Tetramer type

| Exemplified compound No. | $L_1 = L_2 = L_3 = L_4$ | X |
|---|---|---|
| 4077 | 613 | Cl |
| 4078 | 614 | Cl |
| 4079 | 615 | Cl |
| 4080 | 616 | Cl |
| 4081 | 617 | Cl |
| 4082 | 618 | Cl |
| 4083 | 619 | Cl |
| 4084 | 620 | Cl |
| 4085 | 621 | Cl |
| 4086 | 622 | Cl |
| 4087 | 623 | Cl |
| 4088 | 624 | Cl |
| 4089 | 701 | Cl |
| 4090 | 702 | Cl |
| 4091 | 703 | Cl |
| 4092 | 704 | Cl |
| 4093 | 705 | Cl |
| 4094 | 706 | Cl |
| 4095 | 707 | Cl |
| 4096 | 708 | Cl |

A synthetic process of the metal coordination compound used in the present invention will be exemplified below.

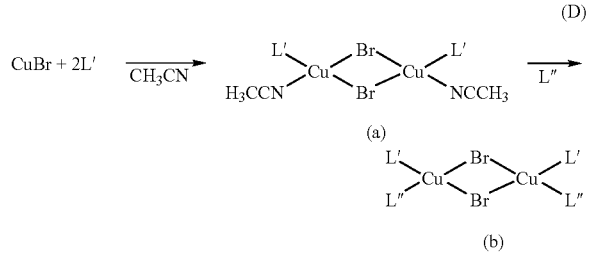

The reaction formulae (A) and (B) are synthetic processes for the dimer type 2 represented by the formulae 9. In the reaction formula (A), a metal coordination compound is prepared from the same type of ligands. In the reaction formula (B), on the other hand, a metal coordination compound is prepared from different ligands. Here, L, $L^1$, and $L^2$ represent bidentate ligands represented by the formulae 10 to 12, respectively, in each of which a nitrogen atom or a phosphorous atom is coordinated with a metal. In the formula, "Cu $(\mu I)_2$Cu" means a structure in which two copper atoms are crosslinked by two iodine atoms. For example, the binding form in which X in the dimer type 1 or 2 in the formulae 9 is replaced with an iodine atom will be shown. In a synthetic process, a copper iodide (1 mmol) is added to 20 ml of toluene or tetrahydrofuran. Then, a ligand is added to a mixture at a ratio represented in the reaction formula, followed by mixing and stirring. Subsequently, a reaction mixture is refluxed for 1 to 2 hours to complete the reaction. The resulting reaction solution is cooled down to the room temperature, whereby the precipitation of a target material is observed. Then, the precipitate is collected and washed with the same solvent as that of the reaction.

The reaction formula (C) is a synthetic process of the tetramer type represented by the formulae 9 and L in the formula is a monodentate ligand represented by the formulae 14 or 15. The reaction solvent or the like may be prepared by the same procedures represented in the reaction formulae (A) and (B) described above.

The reaction formula (D) is a synthetic process of the dimer type 1 represented by the formulae 9. The ligand L' and CuBr are mixed in acetonitrile under stirring. Subsequently, the reaction product, the compound (a), is isolated through filtration and then added with another ligand L" in the presence of chloroform, thereby obtaining the compound (b).

Next, the light-emitting device of the present invention will be described. The characteristic of the light-emitting device of the present invention is to contain the copper coordination compound described above as a light-emitting material in a light-emitting layer. In particular, the light-emitting layer preferably contains the copper coordination compound in a concentration of 100% by part.

The basic configuration of the organic EL device of the present invention is shown in FIGS. 1A to 1D, respectively. In the figures, reference numeral 1 denotes a metal electrode, 2 denotes a light-emitting layer, 3 denotes a hole transporting layer, 4 denotes a transparent electrode, 5 denotes a transparent substrate, and 6 denotes an electron transporting layer.

As shown in FIGS. 1A to 1D, in general, an organic EL device is prepared by stacking a layered structure, in which a single organic layer or plural organic layers is/are sandwiched between the transparent electrode 4 and the metal electrode 1, on the transparent substrate 5.

Figure 1B:
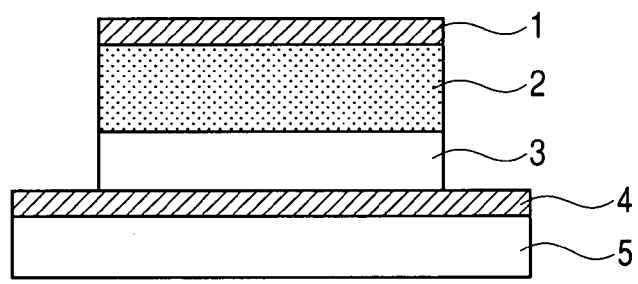
Figure 1C:
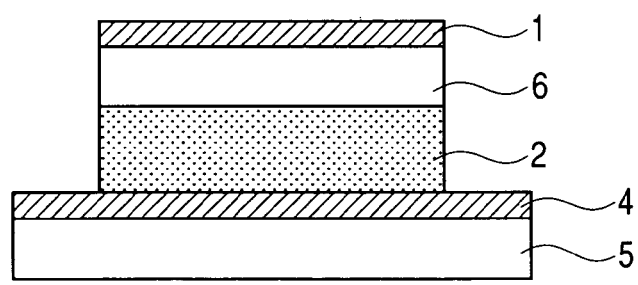
Figure 1D:
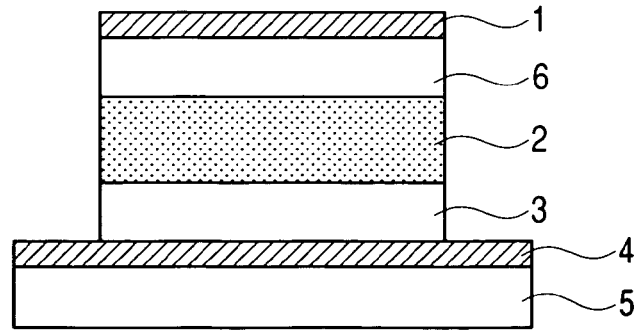

FIG. 1A shows the simplest configuration of the organic EL device, where the organic layer is constructed only of the light-emitting layer 2. In FIG. 1B and FIG. 1C, the organic layer is composed of two layers: the light-emitting layer 2 and the hole transporting layer 3 and the light-emitting layer 2 and the charge transporting layer 6, respectively. In FIG. 1D, the organic layer is composed of three layers: the hole transporting layer 3, the light-emitting layer 2, and the charge transporting layer 6.

An aluminum quinolinol complex or the like (a typical example thereof is Alq shown below) having charge transporting property and luminescence property is used for the light-emitting layer 2. For example, a triphenylamine derivative (a typical example thereof is α-NPD shown below) is mainly used for the hole transporting layer 3. Alternatively, the hole transporting layer 3 may be made of a polymer such as PVK, which has hole transporting property and shows blue EL luminescence itself. An oxadiazole derivative or the like, or Alq, Bphen, or BCP shown below may be used for the charge transporting layer 6.

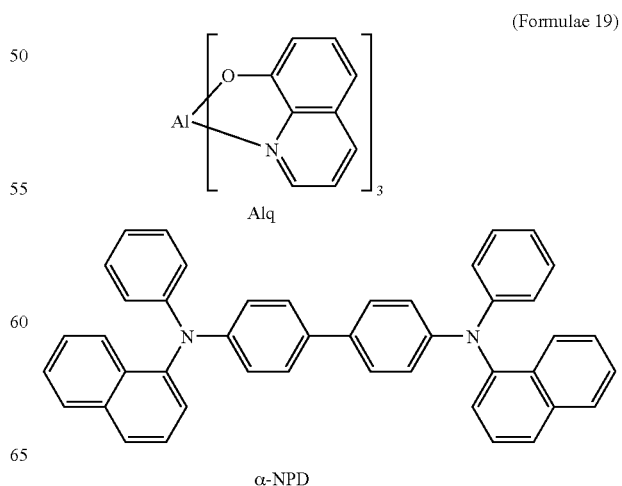

(Formulae 19)

-continued

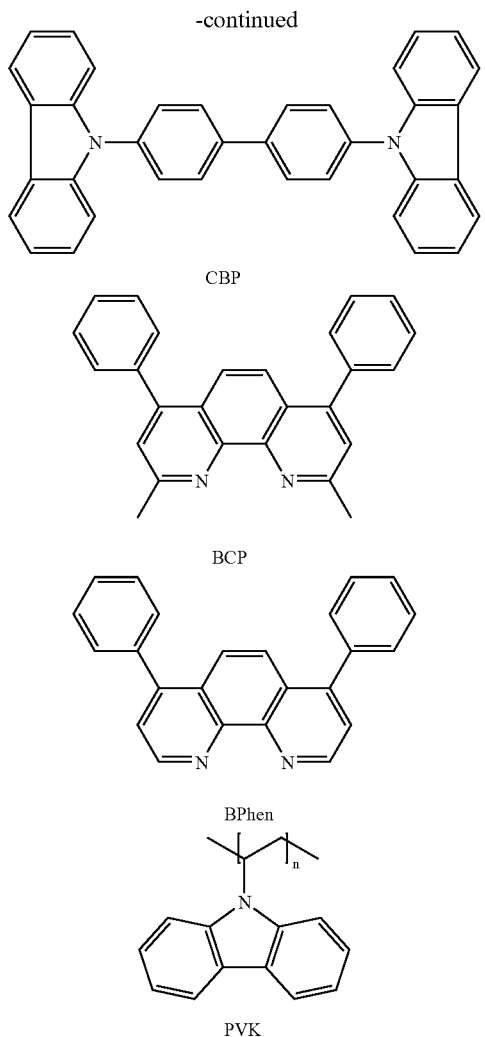

CBP

BCP

BPhen

PVK

EXAMPLES 1 to 9

The following compounds were prepared according the reaction formulae (A) to (C), respectively. Also, the constructions of the respective compounds were identified through $^1$H-NMR (Bruker DPX-400NMR) and elemental analysis (Vario EL CHNOS). In the elemental analysis, the measured value of the element weight ratio of CHN was in good agreement to the calculated value of the element weight ratio of CHN within 0.5% or less error.

In addition, the luminescence property of each compound was measured by means of photoexcitation. Luminescence spectra were measured using F4500 manufactured by Hitachi Instruments Service Co., Ltd. (excitation wavelengths from 350 to 450 nm). All measurements were done in the solid powder state. Luminescent colors ranged from blue green to red. The results of the measurement on luminescence spectrum are listed in Table 5 below.

TABLE 5

| Examples | Exemplified compound No. | Luminescence wavelength of solid powder | Half band width |
|---|---|---|---|
| 1 | 1001 | 636 nm | — |
| 2 | 1002 | 632 nm | 109 nm |

TABLE 5-continued

| Examples | Exemplified compound No. | Luminescence wavelength of solid powder | Half band width |
|---|---|---|---|
| 3 | 1035 | 480 nm | 98 nm |
| 4 | 1038 | 506 nm | 78 nm |
| 5 | 1098 | 629 nm | 155 nm |
| 6 | 1068 | 649 nm | 121 nm |
| 7 | 4001 | 540 nm | — |
| 8 | 4005 | 536 nm | — |
| 9 | 4025 | 580 nm | — |

In the Table 1, "-" corresponds to a half band width of 100 to 150 nm.

Figure 2A:
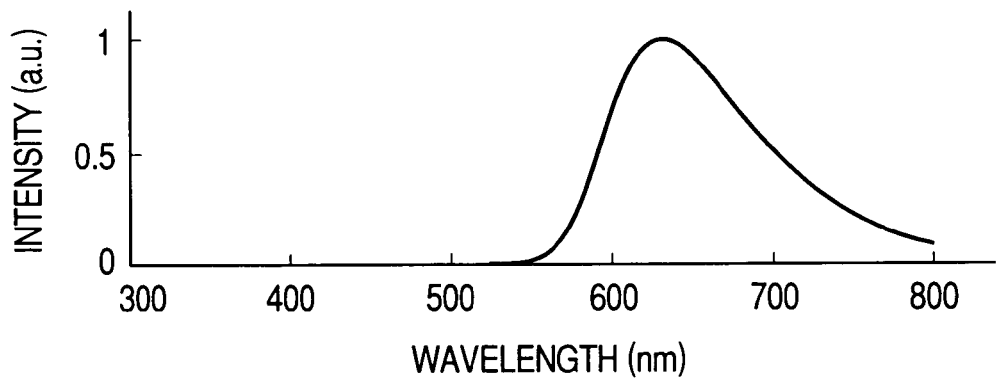
FIGS. 2A, 2B and 2C show luminescence spectra of compounds synthesized in examples of the present invention.
Figure 2B:
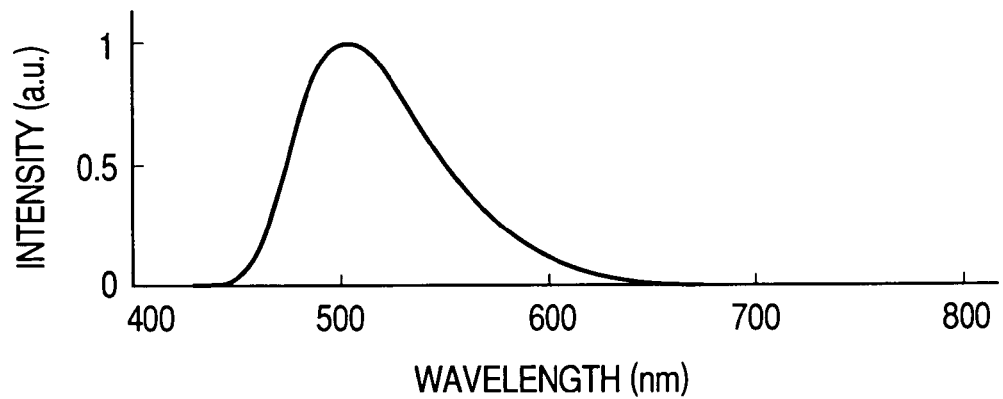
Figure 2C:
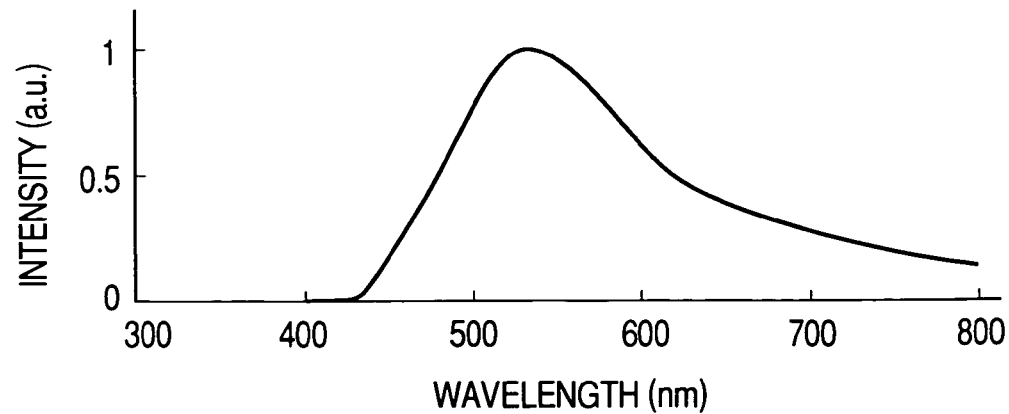

The luminescence spectra of the exemplified compounds 1002, 1138, and 4005 used in Examples 2, 4, and 8 were shown as examples of the luminescence spectra in FIGS. 2A to 2C, respectively. All of them generate luminescence well in the solid state, so that they can be stable compounds under general circumferences at ordinary temperatures.

EXAMPLES 10 to 12

Organic EL devices were prepared using as light-emitting materials the exemplified compounds 1002, 1138, and 4005 synthesized in Examples 2, 4, and 8, respectively.

The configuration of a device having three organic layers shown in FIG. 1D was employed as a configuration of the organic EL device. More specifically, on a glass substrate (i.e., the transparent substrate 5), ITO (transparent electrode 4) of 100 nm in thickness was patterned so as to have an electrode area of 3.14 mm$^2$.

On the ITO substrate, PEDOT (for organic EL) manufactured by Bayer AG was applied in 40 nm in film thickness by means of spin coating at a speed of 1,000 rpm (20 seconds). Then, the resulting coating was dried at 120° C. for 1 hour in a vacuum chamber. On the resulting layered product, subsequently, a solution, which contained 10 g of chlorobenzene, 92 mg of polyvinyl carbazole (an average molecular weight of 9,600), and 8 mg of the exemplified compound 1002, 1138, or 4005, was applied by means of a spin coating at 2,000 rpm for 20 sec under nitrogen atmosphere, thereby obtaining an organic film (light emitting layer 2) of 50 nm in thickness.

After the film formation, the substrate was dried under the same condition as that of the film formation of PEDOT. The substrate was then mounted on a vacuum deposition chamber to form a Bphen film of 40 nm in film thickness by means of vacuum deposition. Therefore, the resulting organic layer had a total film thickness of 130 nm.

Subsequently, a cathode (metal electrode 1) having the following composition was formed:

Metal electrode layer 1 (15 nm): AlLi alloy (Li content of 1.8% by mass); and

Metal electrode 2 (100 nm): Al.

After completion of the film formation, the device was removed and evaluations were then conducted.

The properties of the device were evaluated by applying a DC voltage while making the metal electrode 1 negative and the transparent electrode 4 positive.

The voltage-current property of the organic layer showed good rectification property. The emission spectrum and luminescence intensity were measured using spectrum analyzers SR1 and BM7, manufactured by Topcon Corp. The current value at the time of voltage application was measured by 4140Bd manufactured by Hewlett-Packard. The luminescence efficiency was calculated from the luminescence intensity and the measured current value. For EL luminescence, good luminescence was observed at a luminescence of 200 cd/cm² and good luminescence was retained even after 10 hours of current application. The results are shown in Table 6.

EXAMPLE 13

A light-emitting device was prepared by the same way as that of Example 12, except for a light-emitting layer. In this example, the light-emitting layer was prepared in a film thickness of 30 nm using 100% by mass of the exemplified compound 4005 by means of spin coating. For EL luminescence, good luminescence was observed at a luminescence of 200 cd/cm² and good luminescence was retained even after 10 hours of current application. Therefore, it was found that the light-emitting device with higher luminescence efficiency than that of Example 12 can be attained by the formation of a light-emitting layer with 100% content of the exemplified compound 4005. The results are shown in Table 6.

EXAMPLE 14

In this example, all organic layers were prepared using a vacuum deposition process to complete an organic EL device. The material of the hole transporting layer 3 was α-NPD and the material of the light-emitting layer 2 was the exemplified compound 1002 synthesized in Example 2 in content of 100% by mass. In addition, the material of the charge transporting layer 6 was BPhen. Each of those layers was 40 nm in thickness.

The electro-optical property of the light-emitting device of this example was measured to show that a peak luminescence wavelength was 642 nm at the time of 10 V application. At this time, the light-emitting device had a luminescence efficiency of 0.8 cd/A, resulting in stable luminescence. Therefore, it was found that the light-emitting device with higher luminescence efficiency than that of Example 10 can be attained by the formation of a light-emitting layer with 100% content of the exemplified compound 1002. The results are shown in Table 6.

TABLE 6

| Examples | No. of exemplified compound used | Light-emitting layer | EL luminescence wavelength | Luminescence efficiency (cd/A) | Current value at the time of 8 V application (mA/cm²) |
|---|---|---|---|---|---|
| 10 | 1002 | 1002 of 8% by mass in PVK | 640 nm | 0.5 | 41 |
| 11 | 1138 | 1138 of 8% by mass in PVK | 520 nm | 2.2 | 11 |
| 12 | 4005 | 4005 of 8% by mass in PVK | 550 nm | 2.8 | 9 |
| 13 | 4005 | 4005 of 100% by mass | 565 nm | 4.1 | 61 |
| 14 | 1002 | 1002 of 100% by mass | 642 nm | 0.8 | 25 |

EXAMPLES 15 to 17

Figure 4:
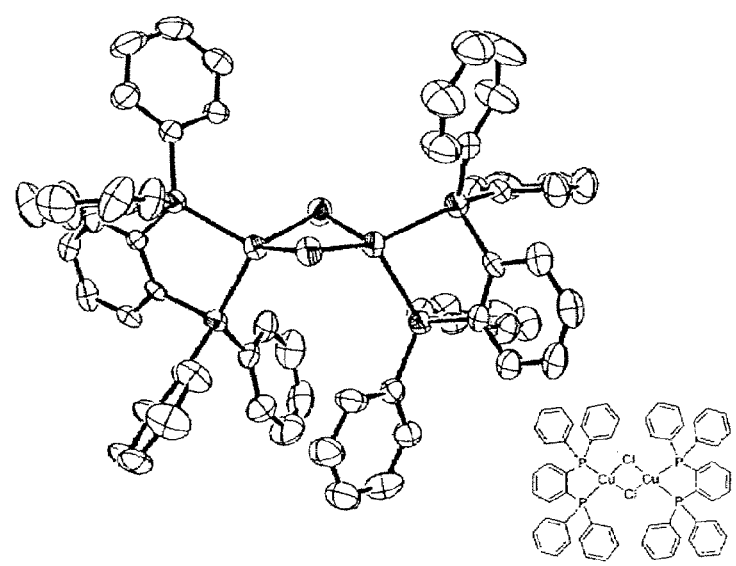
FIG. 4 shows a molecular structure as a result of the crystal analysis of the exemplified compound 1253.

Each of these examples is an example of a two-nuclei metal coordination compound (exemplified compound 1034, 1160, or 1253) using a ligand 504 represented in the formulae 13 as a bidentate ligand. Among the examples of the synthetic process of the metal coordination compound to be used in the present invention, the process of the reaction formula (A) was used to synthesize a desired compound. The synthesized compounds were excellent in thermal stability and had subliming property, so that each of them was purified by sublimation purification under a vacuum pressure of $10^{-1}$ Pa. The identification of the compound was performed using element analysis and X-ray crystal analysis. The element analysis was conducted using an element analyzer Vario EL CHNOS (manufactured by Elementar Co., Ltd.). The X-ray crystal analysis was performed using crystals formed at the time of sublimation purification and a RAXIS RAPID imaging plate (manufactured by Rigakusha). In this case, X ray used was a MoKα ray (λ=0.71069 Å) which was converted into monochrome color though a graphite monochromator. The molecular structure as a result of crystal analysis on the exemplified compound 1253 was shown in FIG. 4.

Figure 3:
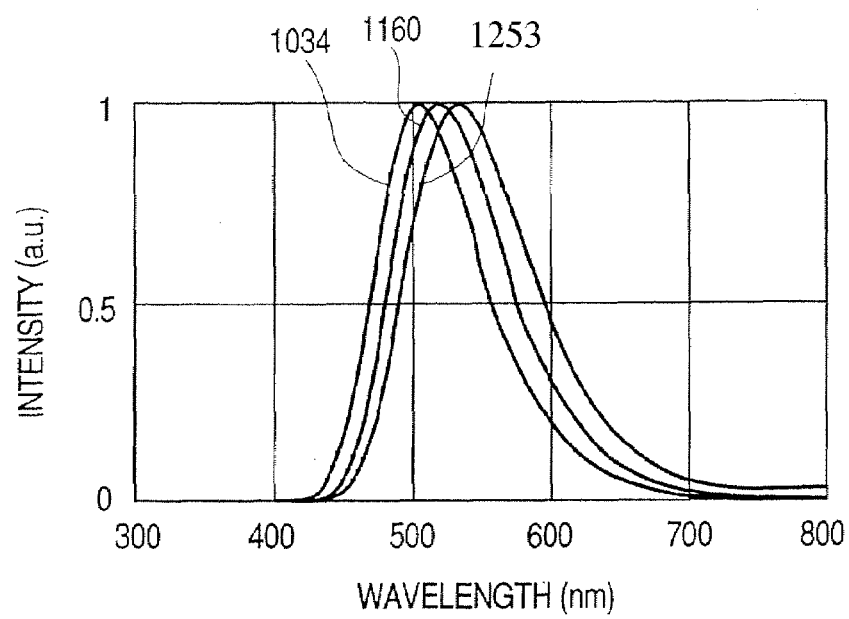
FIG. 3 shows luminescence spectra with respect to the examples of the present invention.

Furthermore, the peak luminescence wavelength of the luminescence spectrum in the solid powder state and the luminescence lifetime are shown in FIG. 3. In the figure, from the left side, the curves correspond to the luminescence spectra of the exemplified compounds 1034, 1160, and 1253, respectively.

TABLE 7

| Example No. | Exemplified compound No. | Luminescence wavelength nm | Luminescence lifetime μsec |
|---|---|---|---|
| 15 | 1034 | 502 | 3.9 |
| 16 | 1160 | 518 | 4.2 |
| 17 | 1253 | 533 | 4.3 |

As described above, the exemplified compounds 1034, 1160, and 1253 are excellent in thermal stability and are capable of generating strong luminescence at wavelength regions from green to yellow green in the solid states.

EXAMPLES 18 to 21

In these examples, organic LED devices were prepared using the exemplified compounds 1034 and 1253 synthesized in Examples 15 and 17 by means of a vacuum deposition process. The device configuration employed a compound represented by the formulae 19. In other words, the configuration was "NPD (50 nm)/CBP: Cu coordination compound (10%) (20 nm, 60 nm)/Bphen (40 nm)". For an electrode, ITO was used on the NPD side, while Al was used on the Bphen side. In addition, 5 nm of potassium fluoride (KF) was layered as an electron injection layer between the Bphen and Al electrodes. For the light-emitting layer, the devices were prepared respectively using two different films having thicknesses of 20 nm and 60 nm. The organic LED devices of the examples showed good rectification property. The data on current-voltage-current-brightness provides the following results. The luminescence spectra of the examples showed longer wavelengths than those of the luminescence spectra in the solid state shown in Examples 15 and 17. In addition, it is also found that the wavelength is longer as the light-emitting layer is thicker.

TABLE 8

| Example No. | Exemplified compound No. | Thickness of light-emitting layer nm | Power efficiency lm/W | Current efficiency cd/A | Luminescence wavelength nm |
|---|---|---|---|---|---|
| 18 | 1034 | 20 | 4.5 | 7 | 545 |
| 19 | 1034 | 60 | 2.1 | 6.4 | 565 |
| 20 | 1253 | 20 | 3.9 | 7.2 | 585 |
| 21 | 1253 | 60 | 0.4 | 5 | 600 |

Each of the copper coordination compounds of Examples 15 and 17 was used as a luminescence dopant in an organic LED device. Consequently, an organic LED device having high luminescence efficiency was obtained.

This application claims priority from Japanese Patent Application No. 2003-343157 filed on Oct. 1, 2003, and Japanese Patent Application No. 2004-267705 filed on Sep. 15, 2004, which are hereby incorporated by reference herein.

What is claimed is:

1. An organic light-emitting device comprising a pair of electrodes and, disposed between the pair of electrodes, a light-emitting layer including a copper coordination compound represented by the following formula:

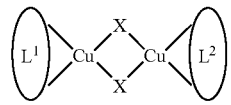

wherein Cu represents a copper atom; X represents a halogen; and $L^1$ and $L^2$ independently represent a N—N bidentate ligand, P—P bidentate ligand or P—N bidentate ligand;

wherein the N—N bidentate ligand has two nitrogen atoms as coordinating atoms, the P—P bidentate ligand has two phosphorus atoms as coordinating atoms, and the P—N bidentate ligand has a nitrogen atom and a phosphorus atom as coordinating atoms;

wherein each nitrogen coordinating atom of the N—N and P—N ligands is a nitrogen atom of an imine group.

2. The organic light-emitting device according to claim 1, wherein the N—N bidentate ligand is represented by one of formulae 201 through 219:

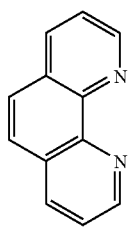

201

-continued

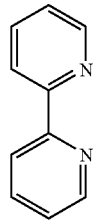

202

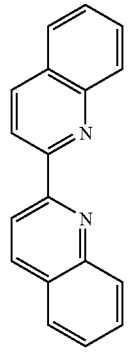

203

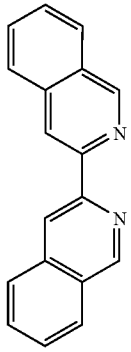

204

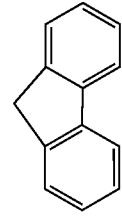

205

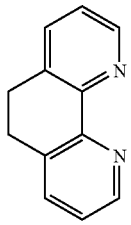

206

-continued
207 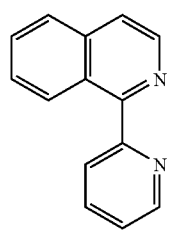
208 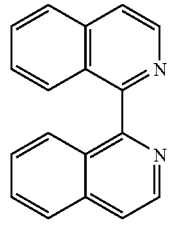
209 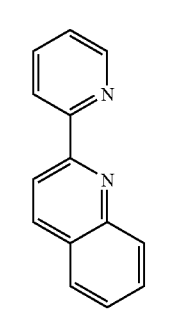
210 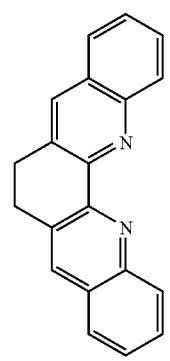
211 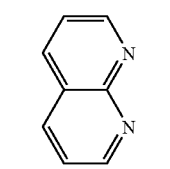
212 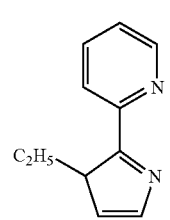
-continued
213 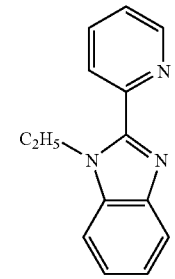
214 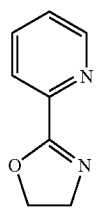
215 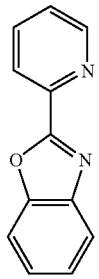
216 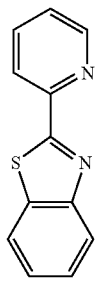
217 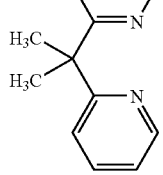
218 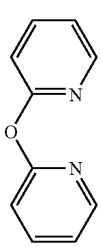

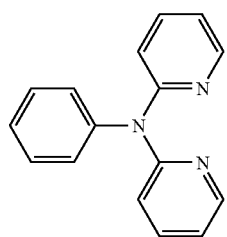
219
the P—N bidentate ligand is represented by one of formulae 401 through 410 and 412:
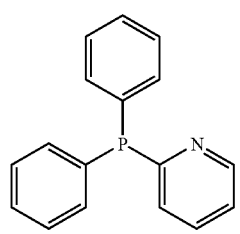
401
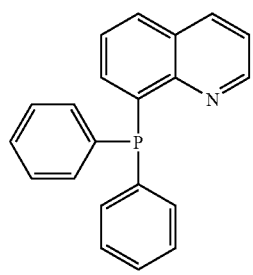
402
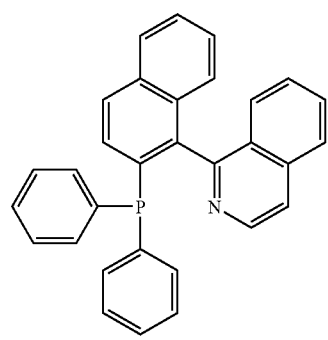
403
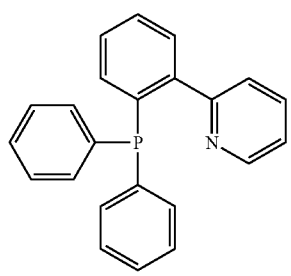
404
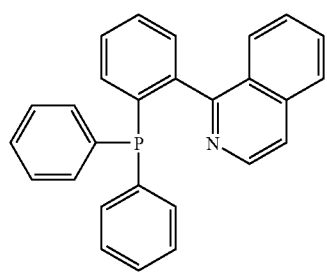
405
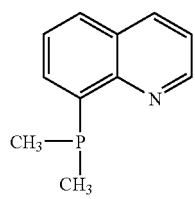
406
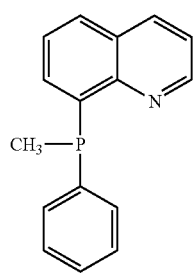
407
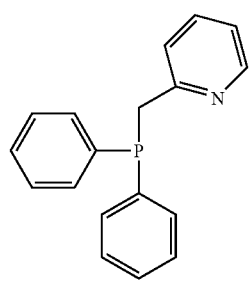
408
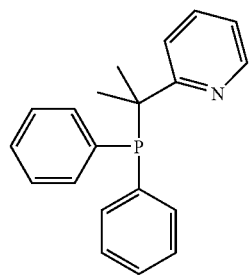
409

-continued

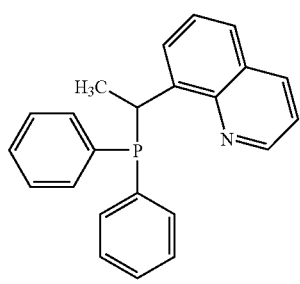
410

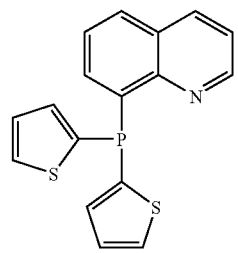
412 and the P—P bidentate ligand is represented by one of formulae 501 through 506:

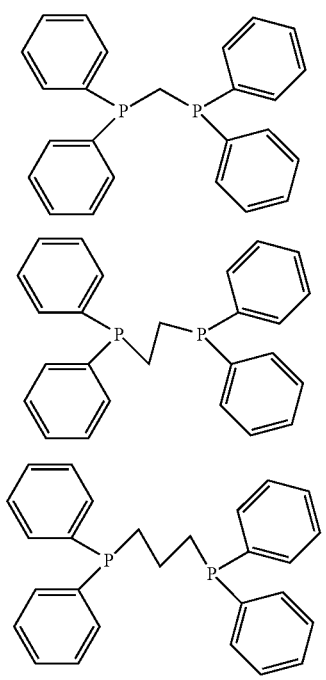
501

502

503

-continued

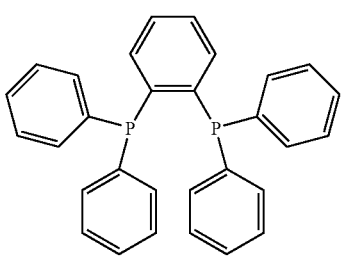
504

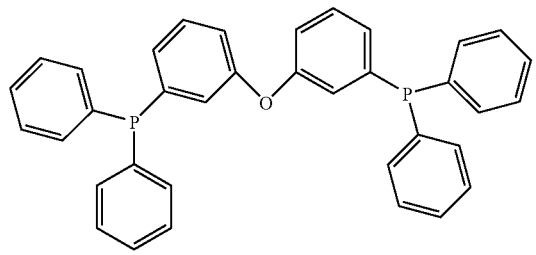
505

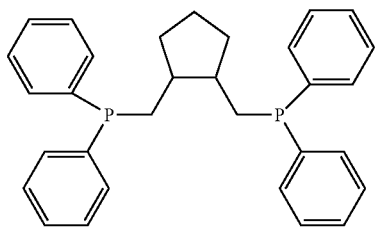
506 wherein the N—N ligand and the P—P ligand may be further substituted with a halogen atom, a linear, branched or cyclic alkyl group, or a substituted or unsubstituted aromatic group, wherein a $CH_2$ group of the alkyl group may be replaced by —O— or —NR—, an H atom of the alkyl group may be replaced by an aromatic ring group or a halogen atom, and R is an alkyl group or a substituted or unsubstituted aromatic ring group.

3. The organic light emitting device according to claim 1 further comprising a hole transporting layer between the pair of electrodes.

4. The organic light emitting device according to claim 1 further comprising an electron transporting layer between the pair of electrodes.

5. The organic light emitting device according to claim 1 further comprising a hole transporting layer and an electron transporting layer between the pair of electrodes.

* * * * *

UNITED STATES PATENT AND TRADEMARK OFFICE
CERTIFICATE OF CORRECTION

PATENT NO.        : 7,413,818 B2
APPLICATION NO.   : 10/951686
DATED             : August 19, 2008
INVENTOR(S)       : Adira Tsuboyama et al.

It is certified that error appears in the above-identified patent and that said Letters Patent is hereby corrected as shown below:

ON THE TITLE PAGE [56] REFERENCES CITED:

Other Publications:
Line 13 after "Araki, et al.;", "comples";" should read --complex";-- and
Line 15 after "Araki, et al.;", "abstract," should read --abstract.--.

COLUMN 1:

Line 24, "et al.." should read --et al.,--.

COLUMN 13:

Form. 308, " 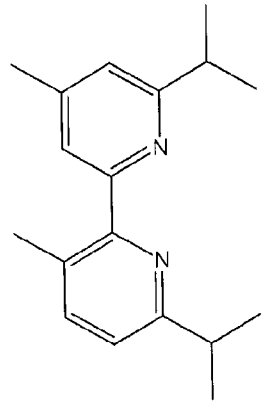 " should read -- 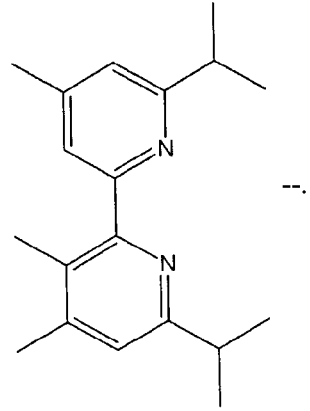 --.

UNITED STATES PATENT AND TRADEMARK OFFICE
CERTIFICATE OF CORRECTION

PATENT NO. : 7,413,818 B2  Page 2 of 4
APPLICATION NO. : 10/951686
DATED : August 19, 2008
INVENTOR(S) : Adira Tsuboyama et al.

It is certified that error appears in the above-identified patent and that said Letters Patent is hereby corrected as shown below:

COLUMN 15:

Form. 403, " 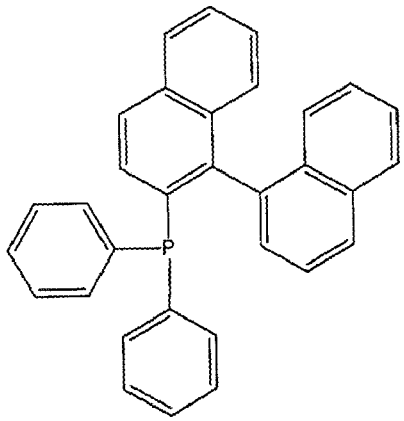 " should read

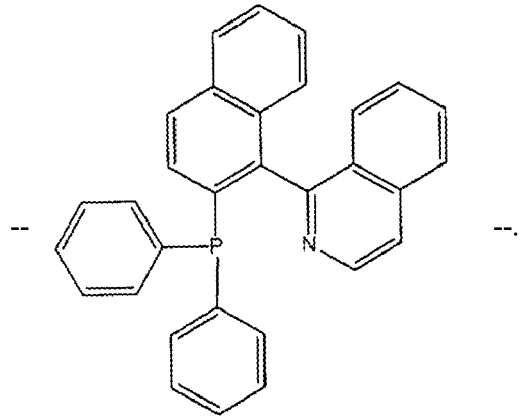

UNITED STATES PATENT AND TRADEMARK OFFICE
CERTIFICATE OF CORRECTION

PATENT NO. : 7,413,818 B2
APPLICATION NO. : 10/951686
DATED : August 19, 2008
INVENTOR(S) : Adira Tsuboyama et al.

It is certified that error appears in the above-identified patent and that said Letters Patent is hereby corrected as shown below:

COLUMN 16:

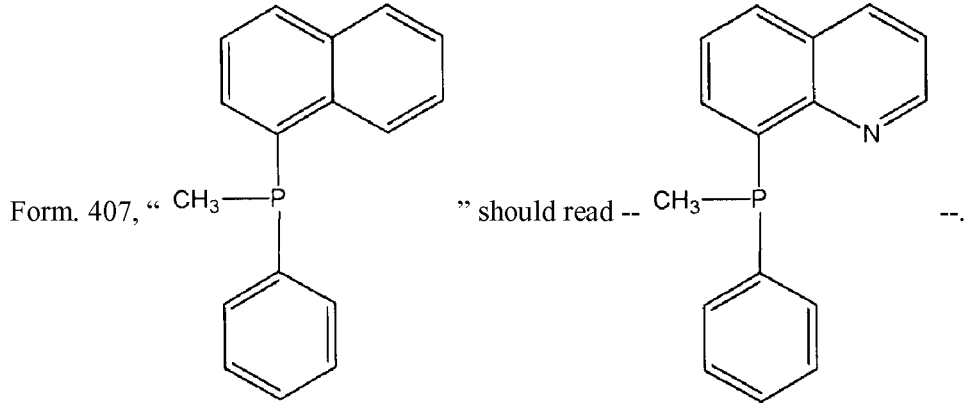

Form. 407, " " should read -- --.

COLUMN 23:

Line 4, "(Formula 15)" should read --(Formulae 15)--.

COLUMN 37:

Line 27, "below." should read --below. ¶
(A) $2L+2CuI \rightarrow LCu(\mu I)_2CuL$
(B) $L'+L^2+2CuI \rightarrow L'Cu(\mu I)_2CuL^2$
(C) $4L+CuI \rightarrow (CuIL)_4$--.

COLUMN 44:

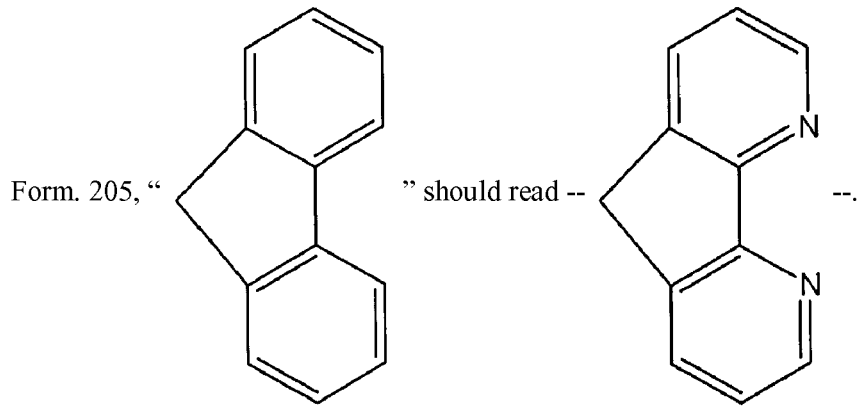

Form. 205, " " should read -- --.

UNITED STATES PATENT AND TRADEMARK OFFICE
CERTIFICATE OF CORRECTION

PATENT NO. : 7,413,818 B2
APPLICATION NO. : 10/951686
DATED : August 19, 2008
INVENTOR(S) : Adira Tsuboyama et al.

It is certified that error appears in the above-identified patent and that said Letters Patent is hereby corrected as shown below:

COLUMN 45:

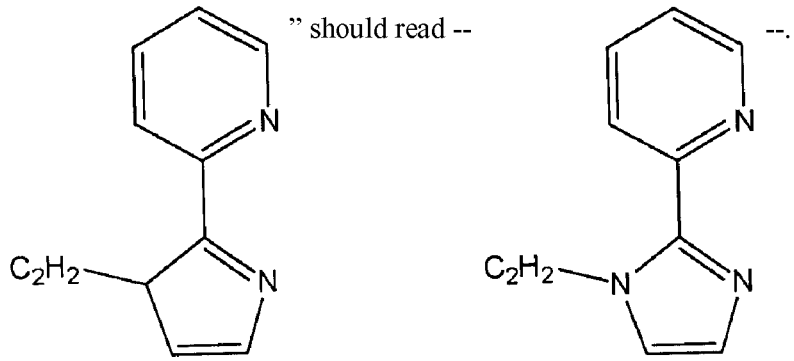

Form. 212, " " should read -- --.

Signed and Sealed this

Seventeenth Day of February, 2009

JOHN DOLL
*Acting Director of the United States Patent and Trademark Office*